(12) United States Patent
Hasbun et al.

(10) Patent No.: US 10,714,159 B2
(45) Date of Patent: Jul. 14, 2020

(54) INDICATION IN MEMORY SYSTEM OR SUB-SYSTEM OF LATENCY ASSOCIATED WITH PERFORMING AN ACCESS COMMAND

(71) Applicant: Micron Technology, Inc., Boise, ID (US)

(72) Inventors: Robert Nasry Hasbun, San Jose, CA (US); Dean D. Gans, Nampa, ID (US); Sharookh Daruwalla, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 15/975,621

(22) Filed: May 9, 2018

(65) Prior Publication Data

US 2019/0348089 A1    Nov. 14, 2019

(51) Int. Cl.
| | |
|---|---|
| *G11C 7/10* | (2006.01) |
| *G11C 7/22* | (2006.01) |
| *G06F 13/36* | (2006.01) |
| *G06F 13/16* | (2006.01) |

(52) U.S. Cl.
CPC ............... *G11C 7/22* (2013.01); *G06F 13/36* (2013.01); *G11C 7/10* (2013.01); *G06F 13/1689* (2013.01)

(58) Field of Classification Search
CPC combination set(s) only.
See application file for complete search history.

(56) References Cited

U.S. PATENT DOCUMENTS

| | | |
|---|---|---|
| 6,115,760 A | 9/2000 | Lo et al. |
| 6,249,461 B1 | 6/2001 | Choi et al. |
| 6,353,874 B1 | 3/2002 | Morein |
| 6,453,389 B1 | 9/2002 | Weinberger et al. |
| 6,692,976 B1 | 2/2004 | Mirkarimi |

(Continued)

FOREIGN PATENT DOCUMENTS

| | | |
|---|---|---|
| WO | 2016097809 A1 | 6/2016 |
| WO | 2017131871 A1 | 8/2017 |

OTHER PUBLICATIONS

ISA/KR, International Search Report and Written Opinion of the International Searching Authority, Int'l Appl. No. PCT/US2019/028683, dated Aug. 27, 2019, Korean Intellectual Property Office, Seo-gu, Daejeon, Republic of Korea, 12 pgs.

(Continued)

*Primary Examiner* — Raymond N Phan
(74) *Attorney, Agent, or Firm* — Holland & Hart LLP

(57) ABSTRACT

Methods, systems, and devices for a latency indication in a memory system or sub-system are described. An interface controller of a memory system may transmit an indication of a time delay (e.g., a wait signal) to a host in response to receiving an access command from the host. The interface controller may transmit such an indication when a latency associated with performing the access command is likely to be greater than a latency anticipated by the host. The interface controller may determine a time delay based on a status of buffer or a status of memory device, or both. The interface controller may use a pin designated and configured to transmit a command or control information to the host when transmitting a signal including an indication of a time delay. The interface controller may use a quantity, duration, or pattern of pulses to indicate a duration of a time delay.

18 Claims, 7 Drawing Sheets

(56) References Cited

U.S. PATENT DOCUMENTS

| | | |
|---|---|---|
| 6,963,954 B1 | 11/2005 | Trehus et al. |
| 7,089,331 B1 | 8/2006 | Gollapudi et al. |
| 7,620,748 B1 | 11/2009 | Bruce et al. |
| 8,549,210 B2 | 10/2013 | Hunter et al. |
| 8,788,765 B2 | 7/2014 | Jeddeloh |
| 8,959,307 B1 | 2/2015 | Bruce et al. |
| 9,780,782 B2 | 10/2017 | Bains et al. |
| 2003/0105926 A1 | 6/2003 | Rodriguez |
| 2004/0128449 A1 | 7/2004 | Osborne et al. |
| 2004/0141374 A1 | 7/2004 | Park et al. |
| 2006/0053256 A1 | 3/2006 | Moyer et al. |
| 2006/0125835 A1 | 6/2006 | Sha et al. |
| 2006/0259735 A1 | 11/2006 | Anand et al. |
| 2006/0265552 A1 | 11/2006 | Davis et al. |
| 2007/0011421 A1 | 1/2007 | Keller et al. |
| 2007/0038829 A1 | 2/2007 | Tousek |
| 2007/0067382 A1 | 3/2007 | Sun |
| 2008/0183977 A1 | 7/2008 | Gower et al. |
| 2009/0063734 A1 | 3/2009 | Kurata et al. |
| 2009/0196102 A1 | 8/2009 | Kim |
| 2010/0268886 A1 | 10/2010 | Frey et al. |
| 2010/0293337 A1 | 11/2010 | Murphy et al. |
| 2012/0185651 A1 | 7/2012 | Kimori |
| 2012/0290768 A1 | 11/2012 | Rubowitz |
| 2014/0040561 A1 | 2/2014 | Lih et al. |
| 2014/0115294 A1 | 4/2014 | Fleischer et al. |
| 2014/0237205 A1 | 8/2014 | Takefman et al. |
| 2015/0347013 A1 | 12/2015 | Mathur et al. |
| 2015/0371689 A1 | 12/2015 | Li et al. |
| 2016/0117131 A1 | 4/2016 | Karamcheti et al. |
| 2016/0350236 A1 | 12/2016 | Tsirkin et al. |
| 2018/0121106 A1 | 5/2018 | Kim |
| 2018/0165211 A1 | 6/2018 | Wang et al. |
| 2018/0373313 A1 | 12/2018 | Hasbun |
| 2018/0373641 A1 | 12/2018 | Rana et al. |
| 2019/0004796 A1 | 1/2019 | Pelster et al. |

OTHER PUBLICATIONS

ISA/KR, International Search Report and Written Opinion of the International Searching Authority, Int'l. Appl. No. PCT/US2019/028688, dated Aug. 29, 2019, Korean Intellectual Property Office, Seo-gu, Daejeon, Republic of Korea, 12 pgs.

ISA/KR, International Search Report and Written Opinion of the International Searching Authority, Int'l Appl. No. PCT/US2019/028841, dated Sep. 24, 2019, Korean Intellectual Property Office, Seo-gu, Daejeon, Republic of Korea, 13 pgs.

ISA/KR, International Search Report and Written Opinion of the International Searching Authority, Int'l Appl. No. PCT/US2019/028843, dated Sep. 26, 2019, Korean Intellectual Property Office, Seo-gu, Daejeon, Republic of Korea, 15 pgs.

U.S. Appl. No. 15/630,330, filed Jun. 22, 2017.

INDICATION IN MEMORY SYSTEM OR SUB-SYSTEM OF LATENCY ASSOCIATED WITH PERFORMING AN ACCESS COMMAND

BACKGROUND

The following relates generally to memory systems or sub-systems and more specifically to a latency indication in a memory system or sub-system.

A memory system may include various kinds of memory devices and controllers, which may be coupled via one or more buses to manage information in numerous electronic devices such as computers, wireless communication devices, internet of things devices, cameras, digital displays, and the like. Memory devices are widely used to store information in such electronic devices. Information may be stored in a memory device by programing different states of one or more memory cells within the memory device. For example, a binary memory cell may store one of two states, often denoted as a logic "1" or a logic "0." Some memory cells may be able to store more than two states.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells, e.g., DRAM cells, may lose their stored logic state over time unless they are periodically refreshed by an external power source.

Improving memory systems, generally, may include reducing system power consumption, increasing memory system capacity, improving read/write speeds, providing non-volatility by use of persistent main memory, or reducing manufacturing costs at a certain performance point, among other metrics.

DETAILED DESCRIPTION

Figure 1:
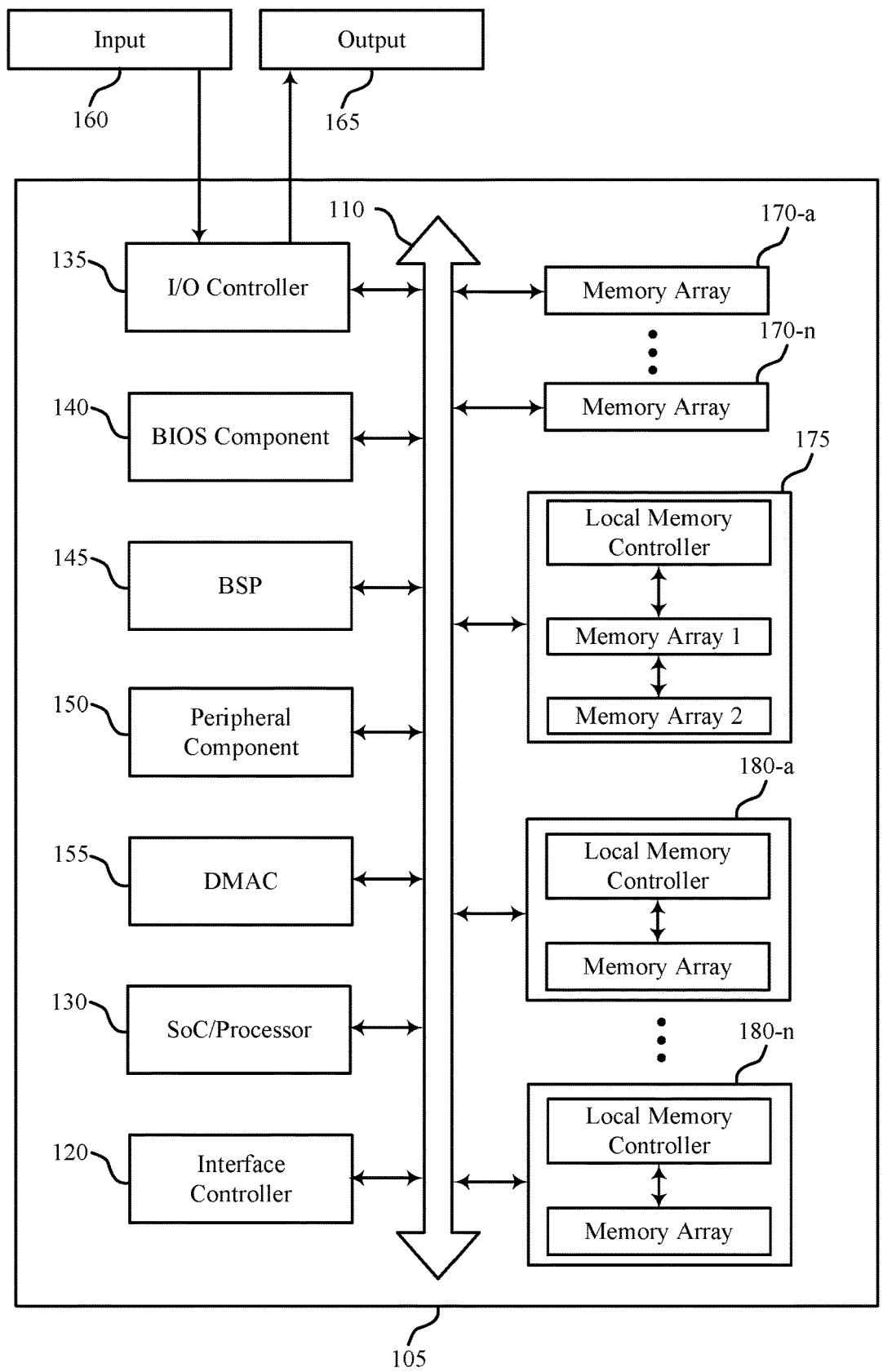
FIG. 1 shows a diagram of a system including a memory system or sub-system that supports a latency indication in a memory system or sub-system in accordance with examples of the present disclosure.

An interface controller of a memory system may determine a latency associated with performing an access command (e.g., a read or write command) received from a host, and in some cases the interface controller may determine that the latency is greater than a latency anticipated by the host. The interface controller may determine the latency based on a status of various constituents of the memory system (e.g., a main memory, which may include one or more memory devices, or a buffer associated with the main memory). In some cases, the interface controller may transmit an indication of a time delay (e.g., a wait signal) to the host in response to receiving the access command from the host. Upon receiving the indication of the time delay, and the host may observe a time delay of some preconfigured or indicated duration prior to issuing a subsequent access command. The interface controller may transmit the indication of the time delay using a pin designated and configured to transmit a command or control information to the host. In some cases, the interface controller may use a quantity, duration, pattern of pulses on the pin to indicate a duration of an indicated time delay.

A memory system may include one or more memory devices as a main memory for a host (e.g., a system on chip (SoC) or processor). In some examples, a memory device may include an array of non-volatile memory cells (e.g., FeRAM cells). The non-volatile memory array, when included as a main memory in a memory system, may provide benefits (e.g., relative to a volatile memory array) such as non-volatility, higher capacity, less power consumption, or variable page size. In the context of a memory device, a page size may refer to a size of data handled at various interfaces. Different memory device types may have different page sizes, and the page size of an individual memory device may be variable or non-variable.

In some cases, one or more aspects of the non-volatile memory array may lack direct compatibility with corresponding aspects of the host—e.g., different latencies associated with access operations (e.g., read or write operations) or different page sizes. As such, the memory system may further include an interface controller to perform or manage various interactions between the host and the memory device. The memory system may also include additional memory elements (e.g., a buffer, a virtual memory bank) that further facilitate interactions between the host and the memory device—e.g., by supporting two sets of latencies associated with access operations, namely one for the host, the other for the memory device. In some cases, the memory device may have a local memory controller (e.g., local to the memory device) that may, in conjunction with the interface controller, perform various operations associated with the array of non-volatile memory cells.

An interface controller of a memory system, while operating with a host, may determine that a latency associated with executing an access command from the host may be greater than a particular latency that the host expects—e.g., the host may be compatible with an industry standard or specification (e.g., a JEDEC low power double data rate (LPDDR) specification) and thus may expect a latency pursuant to one or more LPDDR specifications, while the memory device or some other aspect of the memory system may, in at least some circumstances, support longer latencies. Upon determining a longer latency associated with an access command received from the host, the interface controller may transmit an indication of a time delay (e.g., a wait signal). The interface controller may make such a determination based on a status of a buffer included in the memory system, such as whether the requested data is present in the buffer (e.g., during a read operation) or whether the buffer has an adequate amount of space available (e.g., during a write operation). In addition, the interface controller may determine a duration of the time delay based at least in part on a level of activity of a memory device or some other component of the memory system.

The host may observe the duration of the time delay before transmitting a subsequent access command to the interface controller. In some cases, a duration of the time delay is preconfigured at the host—e.g., the host may wait a predetermined, fixed amount of time in response to any indication of a time delay received from the interface controller. In other cases, a duration of the time delay may be dynamic, and the interface controller may indicate to the host the duration of the time delay associated with particular indication of a time delay, either as part of the indication of the time delay or via a separate signal.

In some cases, the interface controller may receive, from the host, a read command requesting a set of data and determine that the set of data is absent from the buffer (e.g., a read-miss). Read-misses may occur, for example, when the requested set of data has not yet been stored in the buffer (e.g., after an initialization upon a power-up event) or when the requested set of data has been evicted from the buffer (e.g., due to lack of an accessing operation to the set of data for a certain period of time). In some cases, the interface controller may determine whether the set of data exists in the buffer based on accessing content-addressable memory (CAM). In the context of memory technology, CAM may refer to a circuit that combines comparison and memory functionality in each memory circuit. This may be implemented as a look-up table function using a dedicated comparison circuit, for example.

The interface controller may, upon determining that the buffer does not store the requested data, transmit an indication of a time delay to the host. The host may, upon receiving the indication of the time delay, observe the time delay before transmitting a subsequent access command. The duration of the time delay may depend on a latency associated with retrieving the set of data from the main memory (e.g., the memory device including non-volatile memory array). The duration of the time delay may also depend on a state of the memory device (e.g., busy or idle). For example, the interface controller may determine a baseline duration of the time delay when the memory device is in an idle state, and the interface controller may determine an increased duration of the time delay when the memory device is in a busy state (e.g., engaged in activity that the memory device must complete before supporting a later-arrived request, such as retrieving the requested set of data). In some cases, repeated (e.g., multiple) accesses to the memory device (e.g., repeated read-misses) may result in progressively longer time delays, which may result from a different latency associated with accessing the memory device than a latency that the host may expect and a compounding of multiple access attempts. For example, a host interface (e.g., an interface between the host and the interface controller) may support a higher maximum data rate than a memory device interface (e.g., an internal interface between the memory device and the interface controller).

In some cases, successive time delays may accumulate due to successive read-misses (e.g., repeated read accesses to the memory device instead of the buffer), resulting in a longer read latency, and the interface controller may transmit repeated indications of a time delay to the host for the same set of data. For example, when a memory system is initialized (e.g., powered on), the buffer may not include any data from the main memory.

In some cases, the interface controller may receive, from the host, a write command associated with a set of data to store in the memory system. The interface controller may determine, upon receiving the write command or while executing the write command, that an amount of available space in the buffer is inadequate to support a particular latency that the host expects. For example, the interface controller may determine that the buffer is full or nearly full (e.g., has an amount of available space less than a threshold value). The interface controller may determine the threshold value based on a size of the set of data to store or a size of a second set of data that is already stored in the buffer, or both. The interface controller may, upon determining a longer latency associated with the write command, transmit an indication of a time delay to the host.

In the context of a write command, the duration of a time delay may depend on a latency associated with storing data already in the buffer in the main memory. For example, the interface controller may evict data from the buffer to make space in the buffer available for storing the set of data subject to the write command, and may store a modified portion of the evicted data at the main memory (e.g., a memory device that includes a non-volatile memory array). The time delay may thus depend on a state of the memory device (e.g., busy or idle). For example, the interface controller may determine a baseline duration of the time delay when the memory device is in an idle state, and the interface controller may determine an increased duration of the time delay when the memory device is in a busy state (e.g., engaged in activity that the memory device must complete before supporting a later-arrived request, such as, storing the modified portion of the data evicted from the buffer).

In some cases, successive time delays may accumulate, such as when the set of data associated the write command is large (e.g., a stream of video data), and the interface controller may transmit repeated indications of a time delay to the host for the same set of data. In some cases, the interface controller may include in the indication of a time delay or otherwise send to the host information regarding an amount of available space in the buffer such that the host may appropriately determine a next operation—e.g., upon receiving an indication of the time delay, the host may determine to continue transmitting the set of data to the interface controller if the amount of available space in the buffer is greater than or equal to a size of a remaining portion of the set of data, or the host may determine to discontinue transmitting the set of data and observe the time delay before transmitting a subsequent access command if the amount of available space in the buffer is less than a size of the remaining portion of the set of data.

The interface controller may transmit an indication of a time delay (e.g., a wait signal) to the host using a pin designated for sending a command or control information. The pin may be further configured to signal, to the host, information regarding a status of the buffer (e.g., that the buffer lacks the requested data in a read-miss situation, or that the buffer has insufficient space available to write a set of data from the host). In some cases, the interface controller may use a quantity, duration, or pattern of pulses, or any combination thereof, to indicate a duration of a time delay.

Features of the disclosure introduced above are further described below at an exemplary system level in the context of FIG. 1. Specific examples of memory systems and operations are then described in the context of FIGS. 2 through 4. These and other features of the disclosure are further illustrated by and described with reference to the apparatus diagram of FIG. 5, which describes various components related to the interface controller, as well as the flowcharts of FIGS. 7 and 8, which relate to operations of a latency indication in a memory system or sub-system.

FIG. 1 shows a diagram of a system 100 including a memory system or sub-system that supports a latency indication in a memory system or sub-system in accordance with examples of the present disclosure. System 100 may include a device 105. The device 105 may include an interface controller 120, an SoC or processor 130, and various memory devices 170, 175, and 180. Device 105 may also include an input/output controller 135, a basic input/output system (BIOS) component 140, a board support package (BSP) 145, peripheral component(s) 150, and a direct memory access controller (DMAC) 155. The components of device 105 may be in electronic communication with one another through a bus 110.

Device 105 may be a computing device, electronic device, mobile computing device, or wireless device. Device 105 may be a portable electronic device. For example, device 105 may be a computer, a laptop computer, a tablet computer, a smartphone, a cellular phone, a wearable device, an internet-connected device, or the like. In some examples, device 105 may be configured for bi-directional wireless communication via a base station or access point. Device 105 may be capable of machine-type communication (MTC), machine-to-machine (M2M) communication, or device-to-device (D2D) communication. Device 105 may be referred to as a user equipment (UE), station (STA), mobile terminal, or the like.

Interface controller 120 may be configured to interface with SoC/processor 130. Interface controller 120 may also be configured to interface with various memory devices 170, 175, 180, or any combination thereof. In some examples, interface controller 120 may transmit an indication of a time delay (e.g., a wait signal) to SoC/processor 130 in response to receiving an access command (e.g., a read or write command) from SoC/processor 130. Such an indication of a time delay may correspond to a time duration (e.g., a wait period) for SoC/processor 130 to observe before transmitting a subsequent access command, and the time duration may be predetermined (e.g., preconfigured at the host) or dynamically configurable. In some cases, the indication of the time delay may be based on data subject to a read command being absent from a buffer (e.g., memory device 170). In some cases, the indication of the time delay may be based on a buffer (e.g., memory device 170) having an insufficient amount of space available to store a set of data subject to a write command. In some cases, the duration of the time delay may be based on a latency associated with reading data from or writing data to a memory device 180. In some cases, interface controller 120 may include or be coupled with a pin that is designated and configured for transmitting command or control information to SoC/processor 130, which interface controller 120 may use to transmit the indication of the time delay to SoC/processor 130.

SoC/processor 130 may be configured to operate with various memory devices 170, 175, 180, or any combination thereof—either directly or via interface controller 120. SoC/processor 130 may also be referred to as a host and may include a host controller. A host may refer to a computing device coupled with other devices through any means of electronic communication (e.g., a bus, a link, a channel, or a wireless network). In the context of a memory system or sub-system, a host may be a computing device (e.g., central processing unit, graphics processing unit, microprocessor, application processor, baseband processor) coupled with one or more memory devices that collectively function as a main memory for the host. In some cases, SoC/processor 130 may perform some or all of the functions of interface controller 120 described herein.

SoC/processor 130 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some cases, SoC/processor 130 may include a baseband processor that manages radio functions of device 105 in a wireless network environment. In some examples, a separate chip (e.g., a separate chip other than the chip including SoC/processor 130) may include the baseband processor and be coupled with bus 110. The baseband processor may adjust its operational mode as a part of an overall operational scheme of device 105. For example, the baseband processor may change its data transfer rate (e.g., data rate for transmitting or receiving a stream of data over a wireless network) when a memory component (e.g., memory device 180) transmits an indication of a time delay associated with an access command from SoC/processor 130.

Memory devices 170 may each include an array or arrays of memory cells to store digital information. Memory devices 170 may be configured to each operate with SoC/processor 130 and/or interface controller 120. In some examples, memory devices 170 may be configured to provide a buffer memory for a memory bank for SoC/processor 130 or interface controller 120. In some cases, memory devices 170 may include an array of non-volatile memory cells. Device 105 may include any number of memory devices 170.

Memory device 175 may include an array of memory cells and a local memory controller configured to operate with the array of memory cells. In some cases, memory devices 175 may include an array of non-volatile memory cells. The array of memory cells included in memory device 175 may be structured in two or more tiers each having different performance capabilities. The local memory controller of memory device 175 may also be configured to operate with SoC/processor 130 or interface controller 120. First-tier memory cells may be 3D)(Point™ memory, which may provide a high number of input/output operations per second (IOPS) with a short response time to handle various workloads.

Second-tier memory cells may be three-dimensional Not-AND (NAND) memory, which may provide high capacity for data storage at a relatively lower cost than the first-tier memory cells. The local memory controller of memory device 175 may be configured to facilitate the efficient operation of memory cells within memory device 175, which may have different characteristics among memory cells in the two or more tiers, with SoC/processor 130. Memory device 175 may include other types or combinations of memory arrays. In some examples, one or more memory devices 175 may be present in device 105.

Memory devices 180 may include one or more arrays of memory cells and a local memory controller configured to operate with the one or more arrays of memory cells. The local memory controller of memory device 180 may also be configured to operate with SoC/processor 130 or interface controller 120. A memory device 180 may include non-volatile memory cells, volatile memory cells, or a combination of both non-volatile and volatile memory cells. A non-volatile memory cell (e.g., an FeRAM memory cell) may maintain its stored logic state for an extended period of time in the absence of an external power source, thereby reducing or eliminating requirements to perform refresh operations (e.g., refresh operations such as those associated with DRAM cells). In some examples, one or more memory devices 180 may be present in device 105.

The inclusion of an array of non-volatile memory cells (e.g., FeRAM memory cells) in a memory device (e.g., memory devices 170, 175, or 180) may provide various benefits (e.g., efficiency benefits) for device 105. Such benefits may include near-zero standby power (which may increase battery life), instant-on operation following a standby or un-powered (e.g., "off") state, and/or high areal memory density with low system power consumption relative to an array of volatile memory cells. Such features of non-volatile memory system or sub-system may, for example, support the use of computationally intensive (e.g., desktop applications) operations or software in mobile environments. In some cases, device 105 may include multiple kinds of non-volatile memory arrays employing different non-volatile memory technologies, such as one or more FeRAM arrays along with one or more non-volatile memory arrays using other memory technologies. Further, the benefits described herein are merely exemplary, and one of ordinary skill in the art may appreciate further benefits.

In some cases, a memory device (e.g., memory devices 170, 175, or 180) may use a different page size than SoC/processor 130. In the context of a memory device, a page size may refer to a size of data handled at various interfaces, and different memory device types may have different page sizes. In some examples, SoC/processor 130 may use a DRAM page size (e.g., a page size in accord with one or more JEDEC low power double data rate (LPDDR) specifications), and a memory device within device 105 may include an array of non-volatile memory cells that are configured to provide a different page size (e.g., a page size smaller than a typical DRAM page size). In some examples, a memory device may support a variable page size—e.g., a memory device may include an array of non-volatile memory cells (e.g., an FeRAM array) that supports multiple page sizes, and the page size used may vary from one access operation to another—and in some examples, the local memory controller of a memory device (e.g., memory device 175 or 180) may be configured to handle a variable page size for a memory array within the memory device. For example, in some cases, a subset of non-volatile memory cells connected to an activated word line may be sensed simultaneously without having to sense all non-volatile memory cells connected to the activated word line, thereby supporting variable page-size operations within a memory device. In some cases, the page size for an array of non-volatile memory cells may vary dynamically depending on the nature of an access command and a characteristic of (e.g., size or associated latency) associated data (e.g., data subject to the access command). Smaller page size may provide benefits (e.g., efficiency benefits) as a smaller number of memory cells may be activated in connection with a given access operation. The use of variable page size may provide further benefits to device 105, such as configurable and efficient energy usage when an operation is associated with a small change in information by reducing the page size while supporting a high-performance operation by increasing the page size when desired.

DMAC 155 may support direct memory access (e.g., read or write) operations by SoC/processor 130 with respect to memory devices 170, 175, or 180. For example, DMAC 155 may support access by SoC/processor 130 of a memory device 170, 175, or 180 without the involvement or operation of interface controller 120.

Peripheral component(s) 150 may include any input or output device, or an interface for any such device, that may be integrated into device 105. Examples of such peripheral component(s) 150 may include disk controllers, sound controllers, graphics controllers, Ethernet controllers, modems, universal serial bus (USB) controllers, serial or parallel ports, or peripheral card slots, such as peripheral component interconnect (PCI) or accelerated graphics port (AGP) slots. In some cases, peripheral component(s) 150 may include a component (e.g., a control component) that determines an operational mode of device 105 (e.g., a power usage mode, a clock frequency mode). In some cases, the component may include a power-management integrated circuit (PMIC) that provides power to device 105. For example, the component may be an operation mode manager for the device 105 that determines a level of power usage associated with some aspects of the device 105 operations. For example, the operation mode manager may change a power usage level for the device 105 (e.g., by activating or deactivating, or adjusting an operation mode, of one or more aspects of device 105) when a memory component (e.g., memory device 180) transmits an indication of a time delay associated with an access command from SoC/processor 130. In some cases, a PMIC may increase or decrease voltage or current supply levels to device 105 (e.g., to interface controller 120, memory devices 170, 175, or 180) to support an increase or decrease in a bandwidth requirement of device 105. In some cases, the component may receive signals associated with a change in operating clock frequency of interface controller 120. Peripheral component(s) 150 may also include other components or interfaces for other components understood by those skilled in the art as peripherals.

BIOS component 140 or board support package (BSP) 145 may be software components that include a basic input/output system (BIOS) operated as firmware, which may initialize and run various hardware components of system 100. BIOS component 140 or BSP 145 may also manage data flow between SoC/processor 130 and the various components, e.g., peripheral component(s) 150, input/output controller 135, etc. BIOS component 140 or BSP 145 may include a program or software stored in read-only memory (ROM), flash memory, or any other non-volatile memory. In some cases, BIOS component 140 and BSP 145 may be combined as a single component.

Input/output controller 135 may manage data communication between SoC/processor 130 and other devices, including peripheral component(s) 150, input devices 160, or output devices 165. Input/output controller 135 may also manage peripherals that are not integrated into device 105. In some cases, input/output controller 135 may include a physical connection or port to the external peripheral.

Input device 160 may represent a device or signal external to device 105 that provides input to device 105 or its components. Input device 160 may include a user interface or an interface with or between other devices (not shown in FIG. 1). In some cases, input device 160 may be a peripheral that interfaces with device 105 via peripheral component(s) 150 or is managed by input/output controller 135.

Output device 165 may represent a device or signal external to device 105 that is configured to receive output from device 105 or any of its components. For example, output device 165 may include a display, audio speakers, a printing device, or another processor on printed circuit board, etc. In some cases, output device 165 may be a peripheral that interfaces with device 105 via peripheral component(s) 150 or is managed by input/output controller 135.

The components of device 105 may be made up of general purpose or specialized circuitry designed to carry out their respective functions. This may include various circuit elements, for example, conductive lines, transistors, capacitors, inductors, resistors, amplifiers, or other active or passive elements configured to carry out the functions described herein.

Figure 2:
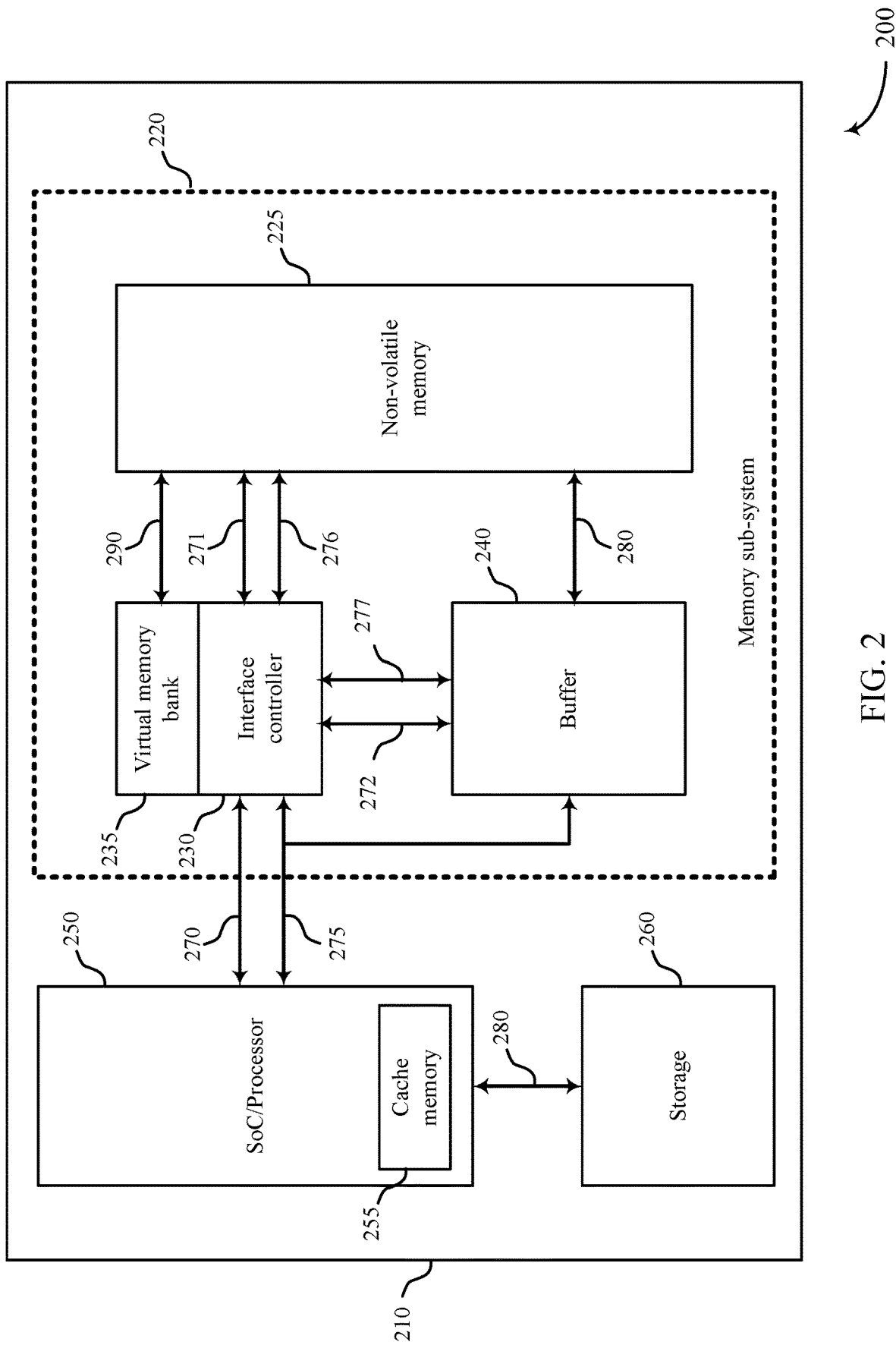
FIG. 2 illustrates an exemplary memory system or sub-system that supports a latency indication in a memory system or sub-system in accordance with examples of the present disclosure.

FIG. 2 illustrates an exemplary system that supports a latency indication in a memory system or sub-system in accordance with examples of the present disclosure. System 200 may include aspects of system 100 as described with reference to FIG. 1 and may include a device 210. Device 210 may include aspects of device 105 as described with reference to FIG. 1. Device 210 may include memory system or sub-system 220, SoC/processor 250, and storage 260. SoC/processor 250 may be an example of an SoC/processor 130 as described with reference to FIG. 1. Memory sub-system 220 may include aspects of a memory device 180 as described with reference to FIG. 1 as well as other aspects of a device 105 as described with reference to FIG. 1. Storage 260 may be an example of a memory device 175 as described with reference to FIG. 1.

SoC/processor 250 (e.g., a host) may be configured to operate with storage 260 via a bus 280 and with memory sub-system 220 via buses 270 and 275. In some examples, bus 280 may be configured to support periphery component interconnect express (PCIe) signaling. Bus 270 may be configured to support LPDDR command and address (CA) signaling, and bus 275 may be configured to support LPDDR input/output (I/O) signaling. In some examples, a local memory array may be disposed on a same substrate as SoC/processor 250 and may be configured to function as a cache memory 255 for SoC/processor 250.

Memory sub-system 220 may include non-volatile memory 225 and interface controller 230. Memory sub-system 220 and non-volatile memory 225 may each be referred to as a memory device or memory devices. Non-volatile memory 225 may be an example of a memory device (e.g., memory device 170, 175, or 180) as described with reference to FIG. 1. Interface controller 230 may be an example of an interface controller 120 as described with reference to FIG. 1. Interface controller 230 may be configured to operate with SoC/processor 250 via buses 270 and 275 pursuant to one or more LPDDR specifications (e.g., page size, timing requirements). Interface controller 230 may include virtual memory bank 235, which may be an example of a memory device 170 as described with reference to FIG. 1. In some examples, virtual memory bank 235 may include DRAM memory cells and may be configured to operate pursuant to an LPDDR specification. Virtual memory bank 235 may be disposed on a same substrate as interface controller 230. In addition, interface controller 230 may be configured to operate with non-volatile memory 225 via buses 271 and 276.

In some examples, buses 270 and 275 coupled between SoC/processor 250 and interface controller 230 may have a higher bandwidth (e.g., a lower latency, a faster access speed) than buses 271 and 276 coupled between non-volatile memory 225 and interface controller 230. For example, buses 270 and 275 may be compatible with one or more LPDDR specifications while buses 271 and 276 may operate with a lower bandwidth (e.g., a ten-times longer latency, a ten-times slower access speed) than buses 270 and 275. For example, a nominal access time associated with non-volatile memory 225 (e.g., via buses 271 and 276) may be on the order of a 100 nsec whereas a nominal access time expected by SoC/processor 250 (e.g., via buses 270 and 275) may be on the order of a 10 nsec. As such, interface controller 230 may manage access operations (e.g., read or write operations) associated with SoC/processor 250 and non-volatile memory 225, which may support the overall operation of memory sub-system 220—e.g., may support two sets of latencies for access operations, namely one associated with SoC/processor 250, the other associated with non-volatile memory 225.

In some cases, interface controller 230 may transmit an indication of a time delay to SoC/processor 250 when an access command received by interface controller 230 from SoC/processor 250 is associated with accessing (e.g., reading from or writing to) non-volatile memory 225. In some cases, interface controller 230 may transmit the indication of a time delay to SoC/processor 250 using a pin that is designated and configured to transmit command or control information to SoC/processor 250. In some examples, interface controller 230 may use bus 270, which may include the designated pin, to transmit the indication of a time delay to SoC/processor 250. The indication of the time delay may comprise on or more pulses on the pin (e.g., signaling pulses may be applied to the pin), and, in some examples, interface controller 230 may use a quantity of pulses, a pulse duration, or a pulse pattern, or any combination thereof, to indicate a duration of the time delay.

In some examples, memory sub-system 220 may further include buffer 240. Buffer 240 may include DRAM memory cells. Buffer 240 may be an example of a memory device 170 or a memory device 180 as described with reference to FIG. 1. In addition, interface controller 230 may be configured to operate with buffer 240 via buses 272 and 277. In some examples, bus 272 may be a buffer CA bus. Bus 277 may be an interface (IF) buffer I/O bus. Interface controller 230 and buses 272 and 277 may be compatible with DRAM protocols. For example, interface controller 230 and buses 272 and 277 may utilize LPDDR page sizes and timings. SoC/processor 250 may be configured to directly operate with buffer 240 via bus 275. In some examples, buffer 240 may be configured to have a page size compatible with bus 275, which may support direct access of buffer 240 by SoC/processor 250.

Buffer 240 may be configured to operate as a logical augmentation of cache memory 255 within SoC/processor 250. The capacity of buffer 240 may be on the order of 256 Megabytes. The capacity of buffer 240 may be based at least in part on the size of cache memory 255 in SoC/processor 250. For example, the capacity of buffer 240 may be relatively large when the size of cache memory 255 is relatively small, or vice versa. In some cases, buffer 240 may have a relatively small capacity, which may facilitate improved (e.g., faster) performance of memory sub-system 220 relative to a DRAM device of a larger capacity due to potentially smaller parasitic components, e.g., inductance associated with metal lines. A smaller capacity of buffer 240 may also provide benefits in terms of reducing system power consumption associated with periodic refreshing operations.

Memory sub-system 220 may be implemented in various configurations, including one-chip versions and multi-chip versions. A one-chip version may include interface controller 230, virtual memory bank 235, and non-volatile memory 225 on a single chip. In some examples, buffer 240 may also be included in the single-chip. In contrast, a multi-chip version may include one or more constituents of memory sub-system 220, including interface controller 230, virtual memory bank 235, non-volatile memory 225, and buffer 240, in a chip that is separate from a chip that includes one or more other constituents of memory sub-system 220. For example, in one multi-chip version, respective separate chips may include each of interface controller 230, virtual memory bank 235, and non-volatile memory 225. As another example, a multi-chip version may include one chip that includes both virtual memory bank 235 and interface controller 230 and a separate chip that includes buffer 240. Additionally, a separate chip may include non-volatile memory 225.

Another example of a multi-chip version may include one chip that includes both buffer 240 and virtual memory bank 235. Additionally, a separate chip may include both interface controller 230 and non-volatile memory 225 or respective separate chips may include each of interface controller 230 and non-volatile memory 225. In yet another example of a multi-chip version, a single chip may include non-volatile memory 225 and buffer 240. Additionally, a separate chip may include both interface controller 230 and virtual memory bank 235 or respective separate chips may include each of interface controller 230 and virtual memory bank 235. Non-volatile memory 225 may include both an array of non-volatile memory cells and an array of DRAM cells. In some cases of a multi-chip version, interface controller 230, virtual memory bank 235, and buffer 240 may be disposed on a single chip and non-volatile memory 225 on a separate chip.

In some examples, non-volatile memory 225 may include an array of non-volatile memory cells (e.g., FeRAM memory cells). The non-volatile array included in non-volatile memory 225 may be configured to support variable page sizes, which may in some cases differ from a page size associated with SoC/processor 250. Further, non-volatile memory 225 may be configured to determine a variable page size for non-volatile memory 225. Non-volatile memory 225 may be referred to as a non-volatile near memory to SoC/processor 250 (e.g., in comparison to storage 260). In the context of a memory system, a near memory may refer to a memory component placed near SoC/processor 250, logically and/or physically, to provide a faster access speed than other memory components. Configuring non-volatile memory 225 as a near memory for SoC/processor 250 may, for example, limit or avoid overhead that may be associated with SoC/processor 250 retrieving data from storage 260. SoC/processor 250 may store critical information in non-volatile memory 225 upon occurrence of an unexpected power interruption—e.g., instead of accessing storage 260, as accessing storage 260 may be associated with an undesired delay. In some cases, non-volatile memory 225 may include a local memory controller (not shown), which may facilitate various operations in conjunction with interface controller 230 or perform some functions ascribed herein to interface controller 230.

Interface controller 230 may be configured to operate with non-volatile memory 225 via buses 271 and 276. In some examples, bus 271 may be an FeRAM CA bus, and bus 276 may be an FeRAM interface (IF) bus. Interface controller 230 and buses 271 and 276 may be compatible with the page size of non-volatile memory 225. In some examples, bus 280 may be configured to facilitate data transfer between buffer 240 and non-volatile memory 225. In some examples, bus 290 may be configured to facilitate data transfer between non-volatile memory 225 and virtual memory bank 235.

Interface controller 230 may support low latency or reduced power operation (e.g., from the perspective of SoC/processor 250) by leveraging virtual memory bank 235 or buffer 240. For example, upon receiving a read command from SoC/processor 250, interface controller 230 may attempt to retrieve requested data from virtual memory bank 235 or buffer 240 for transmission to SoC/processor 250. If data subject to the read command is not present in virtual memory bank 235 or buffer 240, interface controller 230 may retrieve data from non-volatile memory 225 to store the data in virtual memory bank 235 and also (e.g., concurrently) send the data to SoC/processor 250.

Interface controller 230 may manage operations of virtual memory bank 235. For example, interface controller 230 may use a set of flags located in virtual memory bank 235 to identify portions of virtual memory bank 235 storing valid data from non-volatile memory 225. As another example, upon receiving a write command from SoC/processor 250, interface controller 230 may store data at virtual memory bank 235.

Another set of flags located in virtual memory bank 235 may indicate which portions of virtual memory bank 235 store valid data that are modified from corresponding contents of non-volatile memory 225. Valid data stored at virtual memory bank 235 may include data that has been retrieved from non-volatile memory 225 pursuant to a read command from SoC/processor 250 or data that has been received from SoC/processor 250 as a part of write command. In some cases, invalid data present at virtual memory bank 235 may include a set of filler data (e.g., a sequence of "0" or "1" without representing meaningful information). Flags indicating which portions of virtual memory bank 235 store valid data or modified data may support interface controller 230 in saving only the data that has been modified from the corresponding contents in non-volatile memory 225. Furthermore, interface controller 230 may determine where to store data upon removal of the data from virtual memory bank 235 (e.g., when SoC/processor 250 no longer needs the data). Interface controller 230 may monitor and identify the contents of virtual memory bank 235.

In some cases, interface controller 230 may include a counter that records a number of access attempts by SoC/processor 250 to the contents of virtual memory bank 235 during a certain time interval. By way of example, if the counter shows that the number of access attempts by SoC/processor 250 during the time interval is less than a pre-determined threshold value, then upon removal of the data from virtual memory bank 235, interface controller 230 may store modified data (that is, data that was modified by the access attempts by SoC/processor 250) in non-volatile memory 225, as the interface controller 230 may anticipate, based on the relatively low number of prior access attempts, that SoC/processor 250 is not likely to access the data again for some duration of time.

Or, if the counter indicates that the number of access attempts by SoC/processor 250 during the time interval is equal to or larger than the pre-determined threshold value, then interface controller 230 may, upon removal of the data from virtual memory bank 235, store the data in buffer 240, as the interface controller 230 may anticipate that SoC/processor 250 is likely to access the data again soon. One skilled in the art may, in view of overall system requirements, devise various criteria (e.g., criteria including the threshold value of the counter, a clock, a value of the time interval, etc.) for interface controller 230 to use in making such determinations.

In addition, interface controller 230 may set up a by-pass indicator based on the counter when the number of access attempts by SoC/processor 250 is less than the pre-determined threshold value in order to by-pass saving the contents of virtual memory bank 235 to buffer 240. Then, interface controller 230 may directly save the modified contents of virtual memory bank 235 to non-volatile memory 225 based on the by-pass indicator. In some cases, upon removal of the data from virtual memory bank 235, interface controller 230 may determine that the data has not been modified since it was last retrieved from non-volatile memory 225 and may, based on that determination, discard the data (e.g., not write the data to either buffer 240 or non-volatile memory 225).

Figure 3:
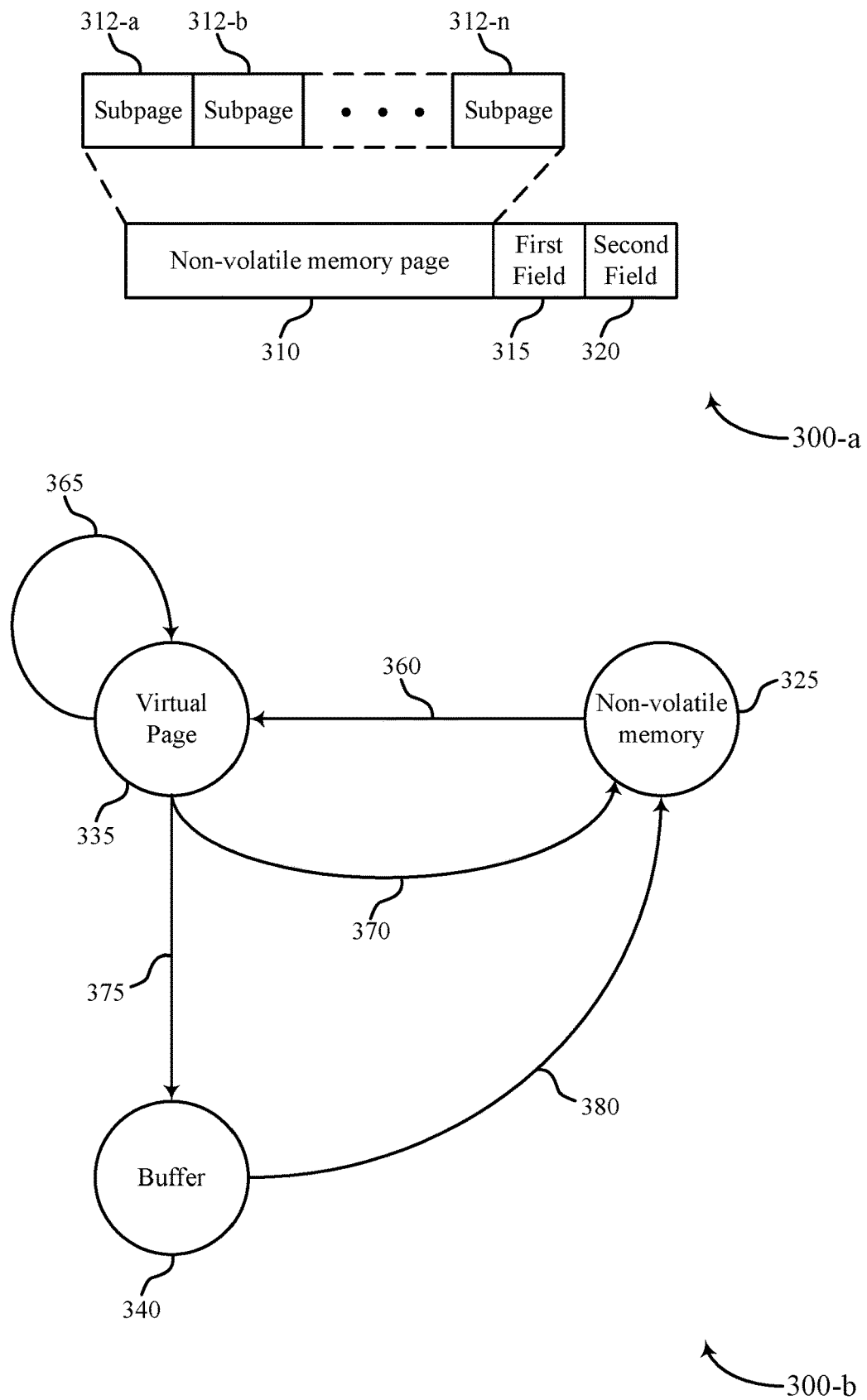
FIG. 3 illustrates an exemplary data structure and state diagram that support a latency indication in a memory system or sub-system in accordance with examples of the present disclosure.

FIG. 3 illustrates an example of a data structure 300-a and a state diagram 300-b that support a latency indication in a memory system or sub-system in accordance with examples of the present disclosure. Data structure 300-a illustrates a non-volatile memory page 310, a first field 315, and a second field 320. In some examples, the non-volatile memory page 310 may be 128 or 256 bytes. In some examples, a memory device (e.g., non-volatile memory 225 as described with reference to FIG. 2, not shown in FIG. 3) may utilize data structure 300-a. In some examples, an interface controller (e.g., interface controller 120 or interface controller 230 as described with reference to FIGS. 1 and 2, not shown in FIG. 3) may perform or manage various operations (e.g., operations 360 through 380) of state diagram 300-b. In some cases, a local memory controller of a memory device (e.g., non-volatile memory 225 as described with reference to FIG. 2, not shown in FIG. 3) may facilitate various operations in conjunction with the interface controller.

In some cases, a memory system or sub-system in accordance with examples of the present disclosure may use data structure 300-a and state diagram 300-b. The apparatus may include a first controller coupled with a buffer and with a memory array comprising non-volatile memory cells, and a bus coupled with the first controller, the first controller configured to send an indication of a time delay associated with an access command (e.g., a read command or a write command) received by the first controller via a pin in electronic communication with the bus and designated for command or control information.

In some examples, the first controller may be configured to determine the time delay based at least in part on availability in the buffer of data associated with a read command, or based on availability in the buffer of space for data associated with a write command, or based on an activity level of the memory array, or based on any combination thereof. In some examples, the apparatus may further include an SoC or processor coupled with the bus, the SoC or processor configured to, based at least in part on the indication of the time delay, observe a fixed wait period before issuing a subsequent access command. In some examples, the apparatus may further include an SoC or processor coupled with the bus, the SoC or processor configured to, based at least in part on the indication of the time delay, observe a configurable wait period specified by the indication of the time delay before issuing a subsequent access command. In some examples, the apparatus may further include a control component coupled with the bus, the control component configured to determine an operational mode of the apparatus based at least in part on receiving the indication of the time delay.

The non-volatile memory page 310 may include a plurality of subpages 312. An interface controller (or an interface controller in conjunction with a local memory controller of non-volatile memory, in some cases) may activate each of the plurality of subpages (e.g., 312-a) independent of other subpages (e.g., 312-b through 312-n) in order to facilitate an energy-efficient page size management. In some examples, the first field 315 and the second field 320 may be stored in a portion of a memory array that is physically located closer to the interface controller (or the local memory controller, in some cases) than the non-volatile memory page 310. The physical proximity of the first field 315 and the second field 320 to the interface controller (or the local memory controller, in some cases) may reduce a delay time associated with activating the first field 315 or the second field 320 (e.g., a delay time to charge a word line associated with a group of memory cells) and retrieving the contents therefrom.

Thus, the portion of memory array corresponding to the first field 315 or the second field 320 may exhibit an access speed faster than a nominal access speed, which may correspond to the access speed of other portions of memory array corresponding to the non-volatile memory page 310. In some cases, an interface controller (e.g., interface controller 230 described with reference to FIG. 2) may specify the portion of memory array having the faster access speed when storing the contents of the first field 315 and the second field 320 in the non-volatile memory. In some cases, a local memory controller may specify the portion of memory array having the faster access speed when storing the contents of the first field 315 and the second field 320.

In some examples, the first field 315 may be configured to indicate (and may be updated to track) a number of times a corresponding non-volatile memory page 310 has been accessed (e.g., read or write) by an SoC/processor (e.g., SoC/processor 250 described with reference to FIG. 2). The first field 315 may be referred to as a saturating counter (SC). The first field 315 may include two bits of information, but it is to be understood that any number of bits may be used in accordance with the teachings herein.

In some examples, the second field 320 may be configured to indicate a size of data in a corresponding non-volatile memory page 310 to be retrieved upon receiving a read command. An interface controller may determine the size of data based on an access pattern to the data made by an SoC/processor in one or more previous access operations and may be referred to as a prefetch size in some cases. A prefetch size may be an amount of data that is to be read in response to a read command for data included in the non-volatile memory page 310. For example, if data from the non-volatile memory page 310 is subject to a read command (e.g., a read command from the interface controller 230 accessing the non-volatile memory page 310, anticipating an access from an SoC/processor), the interface controller (or the interface controller in conjunction with a local memory controller, in some cases) may identify the associated second field 320 and may determine a prefetch size for the requested data based on the associated second field 320, where the prefetch size indicates a size of data (that includes and thus is at least as large as the requested data) to be read from the non-volatile memory 225 in response to the read request.

In some examples, logic states stored in the second field 320 may indicate a prefetch size of the corresponding non-volatile memory page 310. For example, "00" may correspond to 64 bytes, "01" may correspond to 128 bytes, "01" may correspond to 192 bytes, and "11" may correspond to 256 bytes. In such an example, if a read command requests 64 bytes of data from a non-volatile memory page 310, and the associated second field 320 is 01, then the interface controller (or the interface controller in conjunction with a local memory controller, in some cases) may identify the prefetch size for the requested data as 192 bytes and read from the non-volatile memory 225 192 bytes of data, where the 192 bytes includes the requested 64 bytes. It is to be understood that the second field 320 may include any number of bits supporting any number of logic states and may indicate prefetch sizes of any size. In some examples, the second field 320 may be referred to as a prefetch (PF) counter.

In some examples, an interface controller (e.g., interface controller 230 described with reference to FIG. 2, not shown in FIG. 3) may use a set of mode register bits to facilitate the SC and PF counter functionality of a non-volatile memory (e.g., non-volatile memory 225 described with reference to FIG. 2). Mode registers may establish various operation modes (e.g., different test modes, different read or write modes, different performance modes) of a memory device and a set of bits associated with mode registers, which may be referred to as mode register bits, may be used to determine a particular mode of operation.

An interface controller may access the contents of the SC and PF counter using a data mask inversion (DMI) pin along with data during a read operation. In some examples, an interface controller may write the contents of the SC and PF counter with a special command sequence. For example, an interface controller may provide the contents of SC and PF counter to registers associated with the SC and PF counter via column address pins during a write command issued to a non-volatile memory (e.g., non-volatile memory 225 described with reference to FIG. 2).

Diagram 300-b illustrates exemplary operational characteristics of a memory system or sub-system that support features and techniques as described herein. Diagram 300-b illustrates non-volatile memory 325, virtual page 335, and buffer 340. Non-volatile memory 325 may be an example of non-volatile memory 225 described with reference to FIG. 2. Virtual page 335 may be a page within virtual memory bank 235 described with reference to FIG. 2.

In some examples, virtual memory bank 235 may be a superset of multiple virtual pages 335. Buffer 340 may be an example of buffer 240 described with reference to FIG. 2. An interface controller (e.g., interface controller 230 described with reference to FIG. 2, not shown in FIG. 3) may perform or manage various operations (e.g., operations 360 through 380) associated with non-volatile memory 325, virtual page 335, and buffer 340. In some cases, an interface controller may manage an operation by requesting another entity (e.g., a local memory controller of a memory device) to perform the operation.

Operation 360 may include transmitting the contents of a non-volatile memory page 310 from non-volatile memory 325 to virtual page 335 and storing the contents in virtual page 335. The interface controller may carry out operation 360 when an SoC/processor requests data corresponding to the contents of non-volatile memory page 310 that is not present either in the virtual page 335 or the buffer 340. The interface controller may determine that the requested data is not present either in the virtual page 335 or the buffer 340, and accessing the non-volatile memory page 310 may result in a longer latency in providing the requested data to the SoC/processor than a particular latency (e.g., a latency pursuant to an LPDDR specification) anticipated by the SoC/processor.

Upon making the determination, the interface controller may send, to the SoC/processor, an indication of a time delay such that the SoC/processor may wait some duration of time consistent with the indication of the time delay (e.g., a wait signal) before transmitting a subsequent access command (e.g., a read command for the data). The interface controller may send the indication of the time delay using a pin designated and configured for transmitting a command or control signal to the SoC/processor. In some cases, a duration of a time delay may depend on an activity level associated with the non-volatile memory 325 (e.g., whether the non-volatile memory 325 is in an idle state or a busy state). In some cases, the duration of the time delay may be dynamically configurable, and the interface controller may transmit different signals (e.g., different versions of the indication of the time delay) to indicate different durations of the time delay. In other cases, a duration of the time delay may be preconfigured at the host—e.g., the host may wait a predetermined, fixed amount of time in response to receiving each indication of a time delay. An indication of the time delay may comprise one or more pulses on the designated pin, and the interface controller may use a quantity of pulses, a pulse duration, or a pulse pattern, or any combination thereof, to indicate a duration of the time delay.

Additionally, the interface controller may, as part of operation 360, update a value of the first field 315 (e.g., a value of SC) associated with the non-volatile memory page 310, in order to track a number of access events by the SoC/processor for the non-volatile memory page 310.

The interface controller may perform operation 365 when data requested by an SoC/processor (e.g., subject to a read command sent to the interface controller by the SoC/processor) is found in virtual page 335. As part of operation 365, the interface controller may retrieve the requested data from the virtual page 335 and provide the requested data to the SoC/processor without accessing either non-volatile memory 325 or buffer 340. Additionally, the interface controller may update a value of the first field 315 (e.g., a value of SC) associated with the data, in order to track a number of access events by the SoC/processor for the non-volatile memory page 310.

The interface controller may perform operation 370 when a page in virtual page 335 is closed and a value of the first field 315 (e.g., a value of SC) associated with the closed page does not satisfy a threshold value. Virtual page 335 may include one or more pages within virtual memory bank 235 described with reference to FIG. 2. The interface controller may determine to close a page in virtual page 335 when the SoC/processor no longer needs the data associated with the page. Upon determining to close a page in virtual page 335, the interface controller may remove the data to make the memory space corresponding to the page available for the SoC/processor.

In some cases, the interface controller may use a threshold value to determine how to dispose data from a closed page of virtual page 335. In some examples, when a value corresponding to first field 315 (e.g., a value of SC) is less than the threshold value, the interface controller may bypass saving data from a closed page to buffer 340. Instead, the interface controller may store any modified data from the closed page in non-volatile memory 325 and discard any unmodified data from the closed page. In such cases, the interface controller may determine whether data from a closed page include a portion that the SoC/processor has modified relative to corresponding data stored in non-volatile memory 325.

During operation 370, the interface controller may store any modified portion of the data of the closed page in non-volatile memory 325 from virtual page 335. Further, the interface controller may discard any unmodified data from a closed page after determining that the data has not been modified (that is, the interface controller may bypass storing an unmodified portion of the data in non-volatile memory 325). The interface controller may, in view of overall system requirements, determine the threshold value based on various criteria (e.g., a pre-determined value associated with a number of access to the page, a value of a time interval associated with lack of access to the page).

The interface controller may perform operation 375 when the interface controller determines to close a page in virtual page 335 and determines that a value of the first field 315 (e.g., a value of SC) associated with the closed page satisfies the threshold value described above. In some examples, when a value of the first field 315 (e.g., a value of SC) is equal to or greater than the threshold value, the interface controller may save data from a closed page to buffer 340, as the interface controller may determine that the SoC/processor is likely to access the data soon. As such, as a part of operation 375, the interface controller may store data from the closed page in buffer 340.

The interface controller may perform operation 380 when it evicts a page from buffer 340. The interface controller may determine to evict a page from buffer 340 when the page is not accessed by the SoC/processor for a predetermined duration. In some cases, data from an evicted page may include a portion that has been modified by the SoC/processor relative to corresponding data stored in non-volatile memory 325. In such cases, as a part of operation 380, the interface controller may store only a modified portion of the evicted data in non-volatile memory 325. Additionally, as part of operation 380, the interface controller may update (e.g., reset to zero) a value of the first field 315 (e.g., a value of the SC) associated with the evicted page. Further, the interface controller may discard data after determining that the data has not been modified (that is, the interface controller may bypass storing an unmodified portion of the evicted data in non-volatile memory 325).

The interface controller, in some cases, may perform operation 380 to make space available in buffer 340 for storing a set of data associated with a write command received by the interface controller from the SoC/processor. The interface controller may, as a part of operation 380, store a modified portion of evicted data (that is, evicted from buffer 340) in non-volatile memory 325. As such, the interface controller may determine that a latency associated with accessing the non-volatile memory page 310 within non-volatile memory 325 may result in a longer latency in storing the set of data subject to the write command in buffer 340 than a particular latency (e.g., a latency pursuant to an LPDDR specification) anticipated by the SoC/processor.

Upon making a determination of a latency longer than that anticipated by the SoC/processor, the interface controller may send, to the SoC/processor, an indication of a time delay such that the SoC/processor may wait some duration of time consistent with the indication of the time delay (e.g., a wait signal) before transmitting a subsequent access command (e.g., a write command for the data). The interface controller may send the indication of the time delay using a pin designated and configured for transmitting a command or control signal to the SoC/processor. In some cases, a duration of a time delay may depend on an activity level associated with the non-volatile memory 325. In some cases, the duration of the time delay may be dynamically configurable, and the interface controller may transmit different signals to indicate different durations of the time delay. In other cases, a duration of the time delay may be preconfigured at the host—e.g., the host may wait a predetermined, fixed amount of time in response to receiving each indication of a time delay. The indication of the time delay may comprise one or more pulses on the designated pin, and the interface controller may use a quantity of pulses, a pulse duration, or a pulse pattern, or any combination thereof, to indicate a duration of the time delay.

Figure 4:
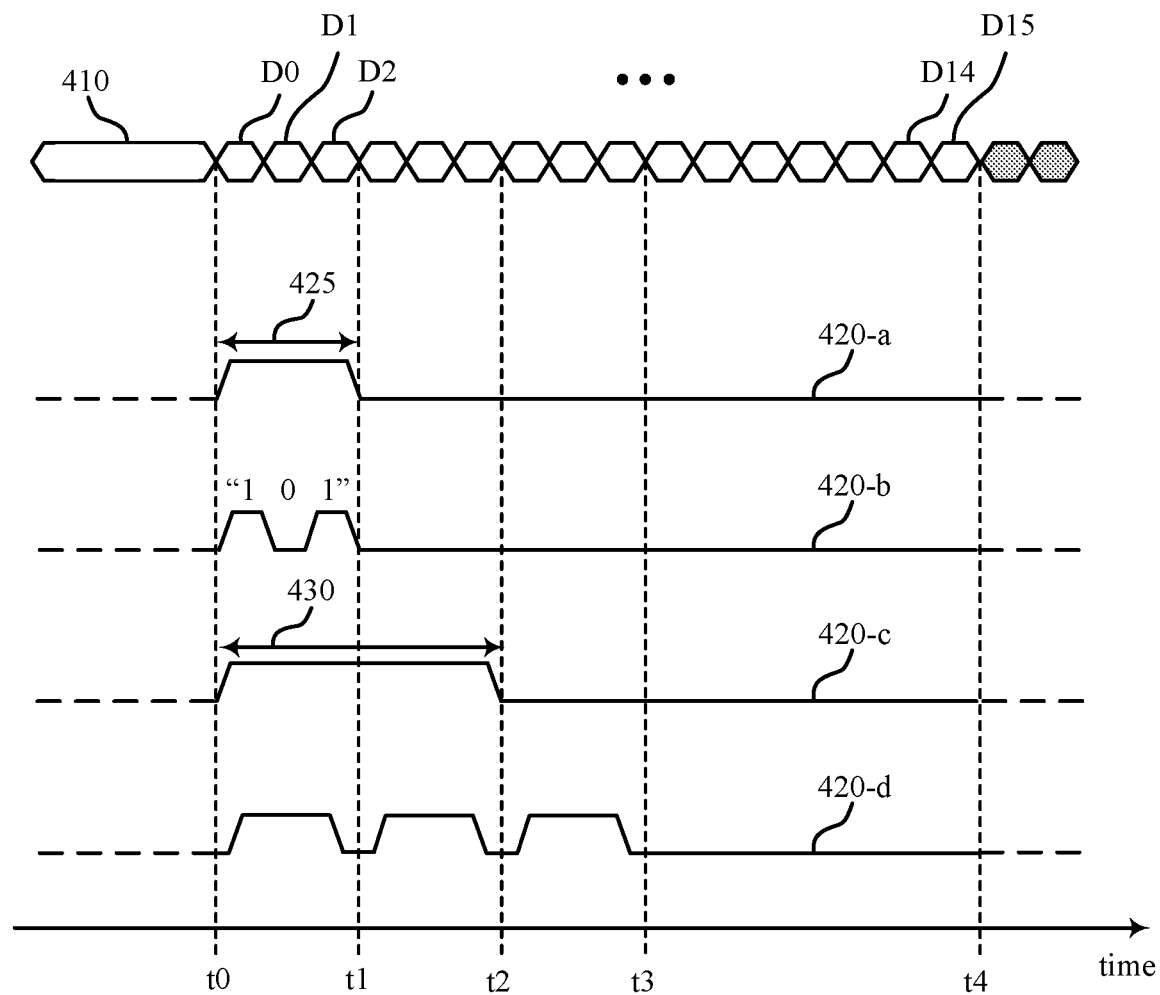
FIG. 4 illustrates an example of a timing diagram that supports a latency indication in a memory system or sub-system in accordance with examples of the present disclosure.

FIG. 4 illustrates an example of a timing diagram 400 that supports a latency indication in a memory system or subsystem in accordance with examples of the present disclosure. The timing diagram 400 illustrates wait signaling during an access operation (e.g., a read command or a write command). The timing diagram 400 includes signal 410 that may be an example of a set of data being transmitted between an interface controller (e.g., interface controller 230 described with reference to FIG. 2) and an SoC/processor (e.g., SoC/processor 250 described with reference to FIG. 2) during the access operation. In some examples, the signal 410 may include sixteen pulses (e.g., D0 through D15), which may be a single set of data, though it is to be understood that a set of data may comprise any amount of information (e.g., bits) and may be represented by any number of pulses of the signal 410. In some cases, the interface controller (or the SoC/processor) may transmit the signal 410 over a CA bus (e.g., bus 270 described with reference to FIG. 2). The interface controller (or the SoC/processor) may use one or more data pins to transmit the signal 410. Additionally, the signal 410 may serve as a reference point (e.g., a timing reference) with respect to which of the various features of wait signal 420 (e.g., a quantity, duration, or pattern of pulses associated with the wait signal 420) may be described.

The timing diagram 400 also includes examples of a wait signal 420 (e.g., wait signal 420-a through wait signal 420-d). The interface controller may transmit one or more of the examples of wait signal 420 to the SoC/processor upon determining that executing an access command received from the SoC/processor is likely to incur a longer latency (e.g., a read latency or a write latency) than a latency that the SoC/processor anticipates (e.g., a latency pursuant to an LPDDR specification). The wait signal 420 may include an indication of a time delay for the SoC/processor to observe before transmitting a subsequent access command (e.g., a repeated read or write command) to the interface controller. Such a time delay may be based on the interface controller determining to access a non-volatile memory (e.g., non-volatile memory 225 or non-volatile memory 325 described with reference to FIG. 2 or FIG. 3) to perform the access command. Although additional signals (e.g., clock signals, command signals) between the interface controller and the SoC/processor may accompany the signal 410 and the wait signal 420 during an access operation, they are omitted in FIG. 4 in an effort to increase the visibility and clarity of the depicted features of wait signaling.

In some cases, the interface controller receives, from the SoC/processor, a read command requesting a set of data. The interface controller may determine that the set of data is absent from a buffer (e.g., buffer 240 or buffer 340 described with reference to FIG. 2 or FIG. 3). In some cases, the interface controller may include a CAM and determine whether the set of data exists in the buffer based at least in part on accessing the CAM. For example, the interface controller may examine memory cells of the CAM when presented with search data associated with the set of data. The interface controller may, as a result of this examination, determine that the set of data is absent from the buffer when each memory cell of the CAM includes a mismatch relative to the search data. In some cases, such an absence of requested data from a buffer may be referred to as a read-miss. Read-misses may occur when the requested data has not previously been stored in the buffer, for example after an initialization of the memory system or sub-system upon a power-up event. In addition, read-misses may occur when the requested data has been evicted from the buffer. The interface controller may evict data from the buffer when the SoC/processor has not accessed the data for a predetermined duration.

Upon determining that the buffer does not store the set of data, the interface controller may determine to read the set of data from a memory device (e.g., non-volatile memory 225 or non-volatile memory 325) within the memory system or sub-system. In addition, the interface controller may, using wait signal 420, determine to transmit an indication of a time delay to the SoC/processor. The interface controller may determine a duration of the time delay based on a read latency associated with retrieving the set of data from the memory device. In some cases, the interface controller may determine an increased duration of the time delay when the memory device is in a busy state (e.g., an increased duration relative to a baseline duration associated with an idle state of the memory device). The interface controller may determine that the memory is in a busy state based on determining that the memory device is currently engaged in an activity that the memory device must complete before supporting a later-arrived request (e.g., retrieving the set of data).

In some cases, successive time delays (e.g., due to successive read-misses) may accumulate. For example, when a memory system is initialized (e.g., powered on), the buffer may not have been populated with any data retrieved from the memory device (e.g., a main memory of the memory system). As such, a plurality of requests for multiple sets of data may stack up at the memory device resulting in a longer latency to retrieve the set of data. Thus, the interface controller may in some cases determine a duration of the time delay based on a level of prior activity that the memory device may be associated with. In some cases, the interface controller may transmit repeated indications of a time delay to the host for the same set of data.

In some cases, the interface controller receives, from the SoC/processor, a write command associated with a set of data to store in the memory system. The interface controller may determine, upon receiving the write command or while executing the write command, a status of a buffer (e.g., buffer 240 or buffer 340 described with reference to FIG. 2 or FIG. 3). In some cases, the interface controller may determine the status of the buffer based on determining an amount of available space in the buffer.

For example, the interface controller may determine the status of the buffer based on comparing the amount of available space in the buffer to a threshold value. The interface controller may determine the threshold value based on a size of the set of data subject to the write command, a size of a second set of data stored in the buffer (e.g., a unit of data storage configured at a buffer), or a combination of both. For example, the size of the set of data to write may be 64 bytes while the unit of data storage configured at the buffer may be 128 bytes. Then, the interface controller may determine the threshold value to be 512 bytes (e.g., eight times the size of the data to write, four times the size of the data storage configured at the buffer) in order to inform the SoC/processor of the status of the buffer (e.g., a limited amount of available space remaining at the buffer) in advance. It is to be understood that these numbers are merely exemplary. In other cases, the interface controller may determine the threshold value as equal to the size of the set of the set of data subject to the write command, or as some other fixed multiple of either the size of the set of data subject to the write command or of the size of a second set of data stored in the buffer. In some cases, the threshold value may be zero, and the interface controller may determine the status of the buffer based on whether the buffer is full.

The interface controller may, using wait signal 420, send an indication of a time delay based on the status of the buffer—e.g., based on the amount of available space at the buffer being equal to or less than the threshold value (e.g., 512 bytes). In some cases, the indication of the time delay may include (or the interface controller may separately signal) an indication of an amount of available space in the buffer. The SoC/processor may, upon receiving an indication of the status of the buffer (e.g., 512 bytes or less storage space remaining at the buffer), determine a next operation. For example, the SoC/processor may, upon receiving the indication of the status of the buffer, determine to continue transmitting the set of data to the interface controller if the amount of available space in the buffer is greater than a remaining portion of the set of data—e.g., the SoC/processor may keep the bus (e.g., bus 270) open for data transfer on signal 410 to complete transmitting the set of data to the interface controller. As another example, the SoC/processor may, upon receiving the indication of the status of the buffer, determine to discontinue transmitting the set of data and observe the duration of the time delay before transmitting a subsequent access command.

In some cases, the interface controller may determine to evict data (e.g., a second set of data) from the buffer (e.g., in accordance with operation 380 described with reference to FIG. 3) to make space available at the buffer to store the set of data associated with a write command received from the SoC/processor. In some cases, the second set of data to be evicted from the buffer may include a portion that has been modified by the SoC/processor relative to corresponding data stored in the memory device (e.g., non-volatile memory 325). In such cases, the interface controller may store the modified portion of the second set of data in non-volatile memory 325 as a part of operation 380. As such, the duration of the time delay indicated in wait signal 420 (e.g., the indication of the time delay) may depend on a latency associated with storing the modified portion of the second set of data at the main memory (e.g., the memory device including non-volatile memory array) when the second set of data is evicted from the buffer. In some cases, when the buffer is full (or nearly full), the interface controller may complete the write command before retrieving and transmitting data in response to a subsequent read command—e.g., a read latency may depend on a write latency.

In some cases, the interface controller may determine an increased duration of the time delay when the memory device is in a busy state (e.g., an increased duration relative to a baseline duration associated with an idle state of the memory device). The interface controller may determine that the memory device is in a busy state based on determining that the memory device is currently engaged in an activity that the memory device must complete before supporting a later-arrived request (e.g., storing the modified portions of the second set of data). Thus, the interface controller may determine a duration of the time delay based on the status of the buffer, a status of the memory device (e.g., non-volatile memory 325), or both.

In some cases, successive time delays (e.g., due to successive write commands for which insufficient space is available in the buffer) may accumulate. For example, successive time delays may accumulate when the set of data associated the write command is large (e.g., a stream of video data). Thus, in some cases, the interface controller may repeatedly transmit the indication of a time delay to the host for the same set of data.

The host may, upon receiving the indication of the time delay after transmitting an access command (e.g., a read command, a write command), observe the duration of a time delay indicated in the wait signal 420 before transmitting a subsequent access command (e.g., a repeated read or write command for the initial set of data, or a subsequent read or write command for a subsequent set of data). In some cases, the host may wait for a preconfigured duration of a time delay in response to each indication of a time delay received by the host—e.g., the host may wait a predetermined, fixed amount of time in response to the wait signal 420, before transmitting a subsequent access command.

In some cases, the interface controller may transmit the wait signal 420 to the SoC/processor over an I/O bus (e.g., bus 275 described with reference to FIG. 2). The interface controller may transmit the wait signal 420 to the SoC/processor using a separate pin designated and configured for transmitting command or control information to the SoC/processor. The pin may be further configured to signal, to the SoC/processor, information regarding a status of the buffer (e.g., that the buffer lacks the requested data in a read-miss situation, or that the buffer has a limited and/or insufficient amount of space available for writing a set of data). The separate pin may be a pin different than data pins or LPDDR-specified pins. In some cases, the separate pin of the interface controller may be referred to as a response (RSP) pin.

The wait signal 420 may include one or more pulses. In some cases, a duration of a time delay may vary, and the wait signal 420 may indicate different durations of a time delay using different quantities of pulses, different pulse durations associated with the one or more pulses, different pulse patterns, or any combination thereof. Different examples of wait signal 420 may also include an indication of different time delays associated with the access command, an indication of an amount of available space in a buffer when the access command is a write command, or both.

In some cases, a total duration of wait signal 420 may correspond to a duration of signal 410 transmitting a set of data (e.g., D0 through D15 corresponding to a duration of time t0 through time t4). In other cases, a minimum pulse duration in the wait signal 420 may correspond to a duration of a single pulse in the signal 410. As such, in the case where a set of data represented by signal 410 comprises sixteen pulses, the wait signal 420 may have at least 65,536 possible variations (i.e., $2^{16}$ variations, not shown in FIG. 4) by including up to sixteen pulses of either a low (e.g., logic "0") or a high (e.g., logic "1") signal level.

In some cases, as in the example of wait signal 420-a, a wait signal 420 may indicate a duration of a time delay by including a single pulse with a fixed duration 425, and each pulse of wait signal 420-a may indicate a time delay of a predetermined (e.g., preconfigured at the SoC/processor) duration. As an illustrative example, the fixed duration 425 may correspond to a duration of three pulses in signal 410 (e.g., a duration between time t0 and time t1). It is to be understood that a pulse of fixed duration in accordance with the teachings herein may be of any duration. For example, a single pulse of fixed duration 425 may indicate a particular duration of a time delay associated with a read latency (e.g., 120 nsec) for the interface controller to retrieve a first set of data requested by the SoC/processor from a non-volatile memory—e.g., after determining that the first set of data is absent in a buffer in a response to the read command from the SoC/processor requesting for the first set of data. Similarly, a single pulse of fixed duration 425 may indicate a particular duration of a time delay associated with a write latency (e.g., 120 nsec) for the interface controller to store a modified portion of a second set of data in a non-volatile memory—e.g., when the interface controller determines to evict the second set of data from a buffer to make space available to store a first set of data associated with a write command received from the SoC/processor.

Upon receiving wait signal 420-a, the SoC/processor may wait for at least the preconfigured duration (e.g., at least 120 nsec) before transmitting a subsequent access command. In some cases, the subsequent access command may be another read command or write command for the first set of data. In other cases, the subsequent access command may be a read or write command for a different set of data.

In some cases, as in the example of wait signal 420-b, a wait signal 420 may indicate a dynamically configurable duration of a time delay using a sequence of pulses (e.g., a pulse pattern) as illustrated in wait signal 420-b. For example, wait signal 420-b may include three pulses representing a logic state of "101" during the duration 425. For example, the three pulses representing the logic state of "101" may carry the same indication of the duration of a time delay as wait signal 420-a (e.g., 120 nsec). As another example, the three pulses of wait signal 420-b may be modified (e.g., to represent a logic state of "110," not shown) to indicate a different duration of a time delay—e.g., 300 nsec instead of 120 nsec when a memory device that the interface controller determines to access is in a busy state. It is to be understood that any pulse pattern may be used for to indicate any duration of a time delay in accordance with the teachings herein.

Upon receiving wait signal 420-b, the SoC/processor may wait for at least the duration of the time delay (e.g., at least 120 nsec or 300 nsec) dynamically indicated by the wait signal 420-b before transmitting a subsequent access command. In some cases, the subsequent access command may be another read command or write command for the first set of data. In other cases, the subsequent access command may be a read or write command for a different set of data.

In some cases, as in the example of wait signal 420-c, a wait signal 420 may indicate a dynamically configurable duration of a time delay (e.g., different than the duration indicated by wait signal 420-a) by including a single pulse having a configurable duration 430 (e.g., a duration corresponding to six pulses in signal 410, i.e., a duration between time t0 and time t2). For example, the duration of configurable duration 430 may be variable and proportional to the duration of the indicated time delay—e.g., a pulse with a longer configurable duration 430 may indicate a longer time delay—and the SoC/processor may be preconfigured with the relationship between configurable duration 430 and the duration of the time delay. The interface controller may determine an increased duration of the time delay indicated by wait signal 420-c, and thus an increased configurable duration 430, based on a status (e.g., an activity level) of the non-volatile memory.

For example, a pulse with a first configurable duration 430 (e.g., a relatively short configurable duration 430) may indicate a baseline duration of a time delay associated with a read latency (e.g., 120 nsec) for the interface controller to retrieve a first set of data requested by the SoC/processor. The interface controller may send a pulse with the first configurable duration 430 if the first set of data is absent from a buffer and the non-volatile memory is in an idle state. As another example, a pulse with a second configurable duration 430 (e.g., a relatively longer configurable duration 430) may indicate a longer duration of a time delay associated with a read latency (e.g., 240 nsec) for the interface controller to retrieve a first set of data requested by the SoC/processor. The interface controller may send a pulse with the second configurable duration 430 if the first set of data is absent from a buffer and the non-volatile memory is in a busy state.

Similarly, a pulse with a first configurable duration 430 (e.g., a relatively short configurable duration 430) may indicate a baseline duration of a time delay associated with a write latency (e.g., 150 nsec). The interface controller may send a pulse with the first configurable duration 430 when the interface controller determines to evict a second set of data stored in a buffer to make space available to store a first set of data associated with the write command received from the SoC/processor and that the non-volatile memory that is to store the evicted second set of data is in an idle state. As another example, a pulse with a second configurable duration 430 may indicate a longer duration of a time delay associated with a write latency (e.g., 300 nsec). The interface controller may send a pulse with the second configurable duration 430 when the interface controller determines to evict a second set of data stored in a buffer to make space available to store a first set of data associated with the write command received from the SoC/processor and that the non-volatile memory that is to store the evicted second set of data is in a busy state.

Upon receiving wait signal 420-$c$, the SoC/processor may wait for at least the duration of the time delay (e.g., at least one of 120, 240, 150, or 300 nsec) dynamically indicated by the wait signal 420-$c$ before transmitting a subsequent access command. In some cases, subsequent access command may be another read command or write command for the first set of data. In other cases, the subsequent access command may be a read or write command for a different set of data.

In some cases, as in the example of wait signal 420-$d$, wait signal 420 may include a number of pulses (e.g., three pulses as depicted in wait signal 420-$d$) of an arbitrary duration (e.g., pulse width), which may indicate a duration of a time delay. A quantity of pulses included in a wait signal 420 (e.g., three pulses in wait signal 420-$d$) may indicate a dynamically configurable duration of a time delay in some cases. For example, each pulse of the wait signal 420-$d$ may indicate a duration of 100 nsec, and the SoC/processor may count the quantity of pulses during a given time window (e.g., a duration between time t0 and time t3) to determine the indicated duration of the time delay. Thus, one pulse during the time window may indicate a duration of 100 nsec for the time delay, two pulses during the time window may indicate a duration of 200 nsec for the time delay, and so on. In the example of wait signal 420-$d$, wait signal 420 may indicate a total duration of a time delay corresponding to 300 nsec.

Further, a minimum duration (e.g., a minimum pulse width) of each pulse in wait signal 420 may be the same as fixed duration 425 illustrated in the exemplary wait signal 420-$a$, or may be some other duration, such as the duration as a single pulse in the example of signal 410. The SoC/processor may be configured with what duration of a pulse on wait signal 420-$d$ to count as a single pulse, and if the wait signal 420 is high for consecutive pulse durations, as shown between time t0 and t2 the example of wait signal 420-$d$, the SoC/processor may count the number of pulses as the number of pulse durations during which the wait signal 420 is high. Additionally, a time window during which the SoC/processor may count the quantity of pulses in wait signal 420 may correspond to any portion of the duration of signal 410 transmitting a set of data (e.g., D0 through D15 corresponding to a duration of time t0 through time t4).

It is to be understood that wait signals 420-$a$ through 420-$d$ are illustrative examples of a wait signal 420, and that an interface controller may use any of wait signals 420-$a$ through 420-$d$, either alone or in any combination. It is further to be understood that the particular pulse durations, pulse counts, and pulse patterns explicitly illustrated in FIG. 4 and the particular time durations discussed in reference to FIG. 4 are merely exemplary. The interface controller may use any quantity of pulses, any pulse duration, any pulse pattern, or any combination thereof, to indicate any duration of a time delay in accordance with the teachings herein.

Figure 5:
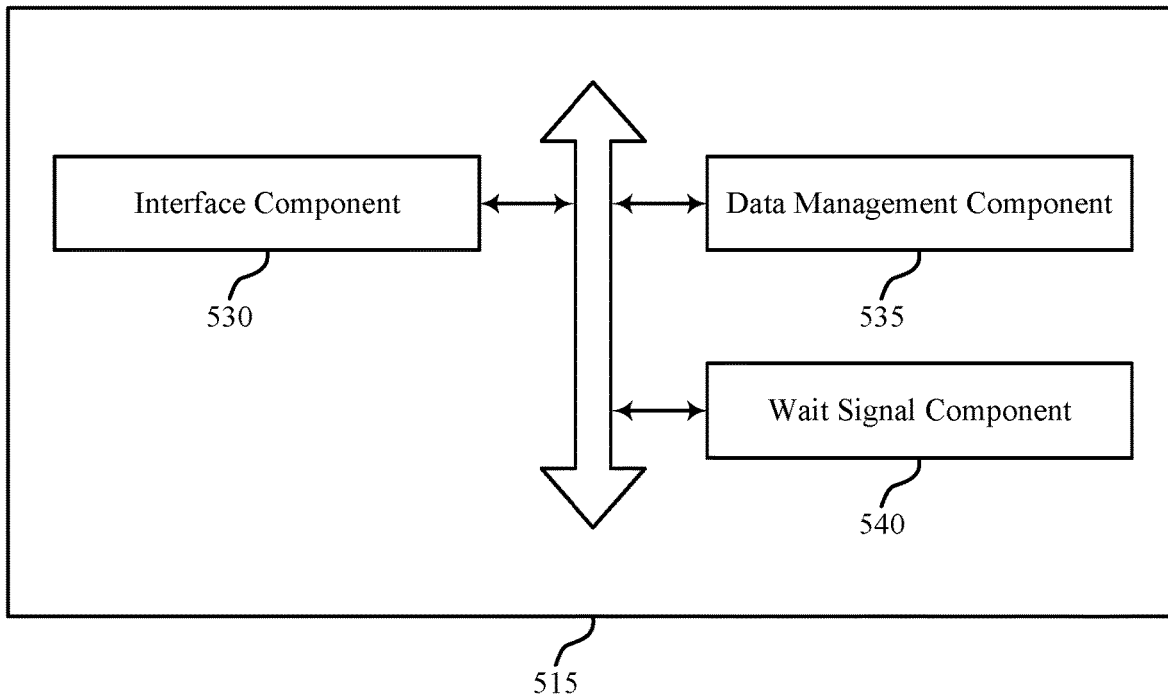
FIG. 5 shows a block diagram of a device that supports a latency indication in a memory system or sub-system in accordance with examples of the present disclosure.

FIG. 5 shows a block diagram 500 of an interface controller 515 that supports a latency indication in a memory system or sub-system in accordance with examples of the present disclosure. The interface controller 515 may be an example of aspects of an interface controller 120 or 230 described with reference to FIGS. 1 and 2. The interface controller 515 may include interface component 530, data management component 535, and wait signal component 540. Each of these modules may communicate, directly or indirectly, with one another (e.g., via one or more buses).

Interface component 530 may receive, from a host, a read command for a set of data at a memory device. Data management component 535 may determine that the set of data is absent from a buffer within the memory device. Interface component 530 may send, to the host, an indication of a time delay for the host to observe before issuing a subsequent access command based on the set of data being absent from the buffer.

In some cases, interface component 530 may also send, to the host, an indication of a time delay for the host to observe before issuing a subsequent access command based on the set of data being absent from the buffer. Interface component 530 may also receive, from a host, a write command for a set of data. Interface component 530 may also send, to the host, an indication of a time delay for the host to observe before issuing a subsequent access command, the indication of the time delay being based on the status of the buffer. Interface component 530 may also send the indication of the time delay for the host to observe includes transmitting one or more pulses on a pin of the memory device.

In some cases, sending the indication of the time delay for the host to observe includes transmitting one or more pulses on a pin of the memory device. In some cases, the pin is designated for command or control information and configured to signal, to the host, status information regarding the buffer. In some cases, the indication of the time delay includes an indication of an amount of available space in the buffer. In some cases, the time delay is based on a latency for writing a second set of data stored in the buffer to the memory array.

Data management component 535 may determine an activity level of a memory array associated with the buffer. Data management component 535 may also determine to read the set of data from a memory array within the memory device based on the set of data being absent from the buffer, where the memory array includes non-volatile memory cells. Data management component 535 may also determine a status of a buffer in a memory device, the memory device including the buffer and a memory array. Data management component 535 may also compare the amount of available space to a threshold value. Data management component 535 may also determine the status of the buffer based on comparing the amount of available space to the threshold value. Data management component 535 may also determine the threshold value based on a size of the set of data, a size of a second set of data stored in the buffer, or any combination thereof.

In some cases, the memory device includes content-addressable memory (CAM), the read command includes search data for the CAM, and determining that the set of data is absent from the buffer includes determining that each memory cell of the CAM includes a mismatch relative to the search data. In some cases, determining the status of the buffer includes determining an amount of available space in the buffer.

Wait signal component 540 may determine a duration of the time delay based on the activity level of the memory array. Wait signal component 540 may also determine to send the indication of the time delay based on determining to read the set of data from the memory array. Wait signal component 540 may also determine a duration of the time delay based on the status of the buffer or a status of the memory array.

In some cases, a duration of the time delay is preconfigured at the host. In some cases, a duration of the time delay is indicated by a quantity of pulses, a pulse duration, or a pulse pattern, or any combination thereof. In some cases, a duration of the time delay is indicated by a quantity of pulses, a pulse duration, or a pulse pattern, or any combination thereof.

Figure 6:
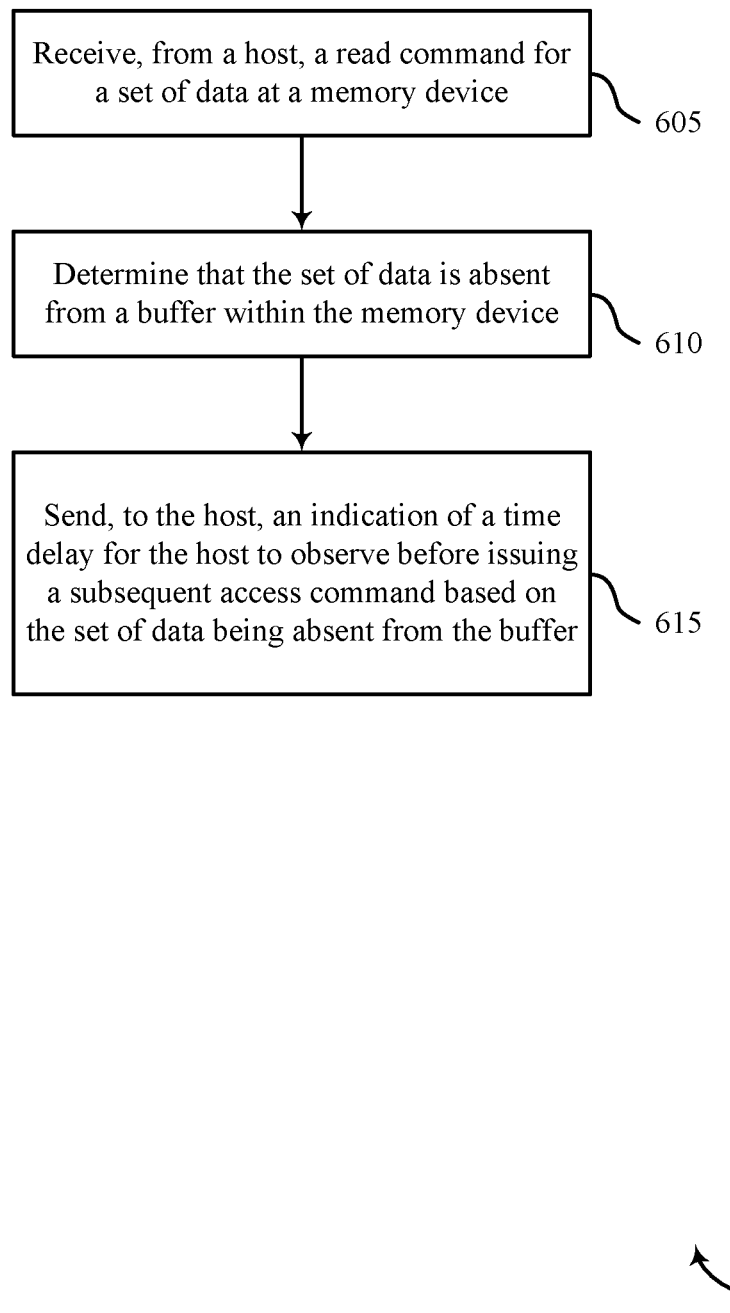
FIGS. 6-7 show flowcharts illustrating a method or methods for a latency indication in a memory system or sub-system in accordance with examples of the present disclosure.

FIG. 6 shows a flowchart illustrating a method 600 for a latency indication in a memory system or sub-system in accordance with examples of the present disclosure. The operations of method 600 may be implemented by a memory system, sub-system, or its components as described herein. For example, the operations of method 600 may be performed by an interface controller 120 or an interface controller 230 as described with reference to FIGS. 1 through 5. In some examples, the interface controller 230 may execute a set of codes to control the functional elements of the memory system to perform the functions described below. Additionally or alternatively, the interface controller 230 may perform aspects of the functions described below using special-purpose hardware.

At 605 the interface controller may receive, from a host, a read command for a set of data at a memory device. The operations of 605 may be performed according to the methods described with reference to FIGS. 1 through 4. In certain examples, aspects of the operations of 605 may be performed by an interface component as described with reference to FIG. 5.

At 610 the interface controller may determine that the set of data is absent from a buffer within the memory device. The operations of 610 may be performed according to the methods described with reference to FIGS. 1 through 4. In certain examples, aspects of the operations of 610 may be performed by a data management component as described with reference to FIG. 5.

At 615 the interface controller may send, to the host, an indication of a time delay for the host to observe before issuing a subsequent access command based at least in part on the set of data being absent from the buffer. The operations of 615 may be performed according to the methods described with reference to FIGS. 1 through 4. In certain examples, aspects of the operations of 615 may be performed by an interface component as described with reference to FIG. 5.

An apparatus for performing the method 600 is described. The apparatus may include means for receiving, from a host, a read command for a set of data at a memory device, means for determining that the set of data is absent from a buffer within the memory device, and means for sending, to the host, an indication of a time delay for the host to observe before issuing a subsequent access command based at least in part on the set of data being absent from the buffer.

Another apparatus for performing the method 600 is described. The apparatus may include a host and an interface controller in electronic communication with the host, wherein the interface controller is operable to receive, from the host, a read command for a set of data at a memory device, determine that the set of data is absent from a buffer within the memory device, and send, to the host, an indication of a time delay for the host to observe before issuing a subsequent access command based at least in part on the set of data being absent from the buffer.

Some examples of the method 600 and apparatus described above may further include processes, features, means, or instructions for determining an activity level of a memory array associated with the buffer. Some examples of the method 600 and apparatus described above may further include processes, features, means, or instructions for determining a duration of the time delay based at least in part on the activity level of the memory array.

In some examples of the method 600 and apparatus described above, sending the indication of the time delay for the host to observe comprises transmitting one or more pulses on a pin of the memory device. In some examples of the method 600 and apparatus described above, a duration of the time delay may be preconfigured at the host. In some examples of the method 600 and apparatus described above, a duration of the time delay may be indicated by a quantity of pulses, a pulse duration, or a pulse pattern, or any combination thereof. In some examples of the method 600 and apparatus described above, the pin may be designated for command or control information and configured to signal, to the host, status information regarding the buffer.

Some examples of the method 600 and apparatus described above may further include processes, features, means, or instructions for determining to read the set of data from a memory array within the memory device based at least in part on the set of data being absent from the buffer, wherein the memory array comprises non-volatile memory cells. Some examples of the method 600 and apparatus described above may further include processes, features, means, or instructions for determining to send the indication of the time delay based at least in part on determining to read the set of data from the memory array.

In some examples of the method 600 and apparatus described above, the memory device comprises content-addressable memory (CAM), the read command comprises search data for the CAM, and wherein determining that the set of data may be absent from the buffer comprises determining that each memory cell of the CAM comprises a mismatch relative to the search data.

Figure 7:
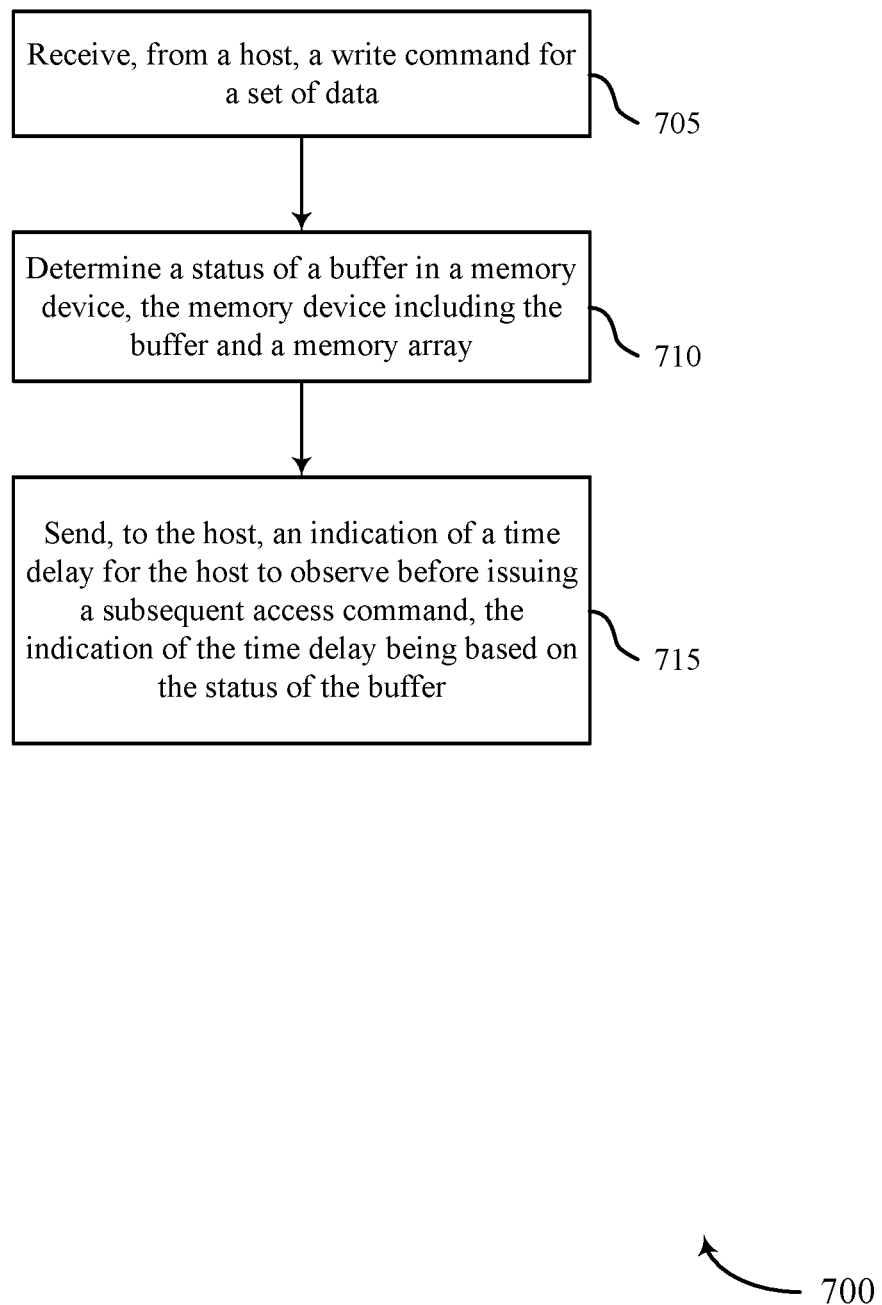

FIG. 7 shows a flowchart illustrating a method 700 for a latency indication in a memory system or sub-system in accordance with examples of the present disclosure. The operations of method 700 may be implemented by a memory system, sub-system, or its components as described herein. For example, the operations of method 700 may be performed by an interface controller 120 or an interface controller 230 as described with reference to FIGS. 1 through 5. In some examples, the interface controller 230 may execute a set of codes to control the functional elements of the memory system to perform the functions described below. Additionally or alternatively, the interface controller 230 may perform aspects of the functions described below using special-purpose hardware.

At 705 the interface controller may receive, from a host, a write command for a set of data. The operations of 705 may be performed according to the methods described with reference to FIGS. 1 through 4. In certain examples, aspects of the operations of 705 may be performed by an interface component as described with reference to FIG. 5.

At 710 the interface controller may determine a status of a buffer in a memory device, the memory device including the buffer and a memory array. The operations of 710 may be performed according to the methods described with reference to FIGS. 1 through 4. In certain examples, aspects of the operations of 710 may be performed by a data management component as described with reference to FIG. 5.

At 715 the interface controller may send, to the host, an indication of a time delay for the host to observe before issuing a subsequent access command, the indication of the time delay being based at least in part on the status of the buffer. The operations of 715 may be performed according to the methods described with reference to FIGS. 1 through 4. In certain examples, aspects of the operations of 715 may be performed by an interface component as described with reference to FIG. 5.

A apparatus for performing the method 700 is described. The apparatus may include means for receiving, from a host, a write command for a set of data, means for determining a status of a buffer in a memory device, the memory device including the buffer and a memory array, and means for sending, to the host, an indication of a time delay for the host to observe before issuing a subsequent access command, the indication of the time delay being based at least in part on the status of the buffer.

Another apparatus for performing the method 700 is described. The apparatus may include a host and an interface controller in electronic communication with the host, wherein the interface controller is operable to receive, from a host, a write command for a set of data, determine a status of a buffer in a memory device, the memory device including the buffer and a memory array, and send, to the host, an indication of a time delay for the host to observe before issuing a subsequent access command, the indication of the time delay being based at least in part on the status of the buffer.

In some examples of the method 700 and apparatus described above, determining the status of the buffer comprises determining an amount of available space in the buffer. Some examples of the method 700 and apparatus described above may further include processes, features, means, or instructions for comparing the amount of available space to a threshold value. Some examples of the method 700 and apparatus described above may further include processes, features, means, or instructions for determining the status of the buffer based at least in part on comparing the amount of available space to the threshold value.

Some examples of the method 700 and apparatus described above may further include processes, features, means, or instructions for determining the threshold value based at least in part on a size of the set of data or a size of a second set of data stored in the buffer, or any combination thereof. In some examples of the method 700 and apparatus described above, the indication of the time delay comprises an indication of an amount of available space in the buffer.

In some examples of the method 700 and apparatus described above, the time delay may be based at least in part on a latency for writing a second set of data stored in the buffer to the memory array.

Some examples of the method 700 and apparatus described above may further include processes, features, means, or instructions for determining a duration of the time delay based at least in part on the status of the buffer or a status of the memory array. In some examples of the method 700 and apparatus described above, sending the indication of the time delay for the host to observe comprises transmitting one or more pulses on a pin of the memory device. In some examples of the method 700 and apparatus described above, a duration of the time delay may be indicated by a quantity of pulses, a pulse duration, or a pulse pattern, or any combination thereof.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, from a host, a read command for a set of data at a memory device;
   determining that the set of data is absent from a buffer within the memory device; and
   sending, to the host, an indication of a time delay for the host to observe before issuing a subsequent access command based at least in part on the set of data being absent from the buffer, wherein sending the indication of the time delay for the host to observe comprises transmitting one or more pulses on a pin of the memory device.

2. The method of claim 1, further comprising:
   determining an activity level of a memory array associated with the buffer; and
   determining a duration of the time delay based at least in part on the activity level of the memory array.

3. The method of claim 1, wherein a duration of the time delay is preconfigured at the host.

4. The method of claim 1, wherein a duration of the time delay is indicated by a quantity of pulses, a pulse duration, or a pulse pattern, or any combination thereof.

5. The method of claim 1, wherein the pin is designated for command or control information and configured to signal, to the host, status information regarding the buffer.

6. The method of claim 1, further comprising:
   determining to read the set of data from a memory array within the memory device based at least in part on the set of data being absent from the buffer, wherein the memory array comprises non-volatile memory cells; and
   determining to send the indication of the time delay based at least in part on determining to read the set of data from the memory array.

7. A method, comprising:
   receiving, from a host, a read command for a set of data at a memory device, wherein the memory device comprises content-addressable memory (CAM) and the read command comprises search data for the CAM;
   determining that the set of data is absent from a buffer within the memory device, wherein determining that the set of data is absent from the buffer comprises determining that each memory cell of the CAM comprises a mismatch relative to the search data; and sending, to the host, an indication of a time delay for the host to observe before issuing a subsequent access command based at least in part on the set of data being absent from the buffer.

8. A method, comprising:

receiving, from a host, a write command for a set of data;

determining a status of a buffer in a memory device, the memory device including the buffer and a memory array;

sending, to the host, an indication of a time delay for the host to observe before issuing a subsequent access command, the indication of the time delay being based at least in part on the status of the buffer, wherein sending the indication of the time delay for the host to observe comprises transmitting one or more pulses on a pin of the memory device, and wherein a duration of the time delay is indicated by a quantity of pulses, a pulse duration, or a pulse pattern, or any combination thereof.

9. The method of claim 8, wherein determining the status of the buffer comprises:

determining an amount of available space in the buffer;

comparing the amount of available space to a threshold value; and determining the status of the buffer based at least in part on comparing the amount of available space to the threshold value.

10. The method of claim 8, wherein the indication of the time delay comprises an indication of an amount of available space in the buffer.

11. The method of claim 8, wherein the time delay is based at least in part on a latency for writing a second set of data stored in the buffer to the memory array.

12. The method of claim 8, further comprising:

determining the duration of the time delay based at least in part on the status of the buffer or a status of the memory array.

13. The method of claim 9, further comprising:

determining the threshold value based at least in part on a size of the set of data or a size of a second set of data stored in the buffer, or any combination thereof.

14. An apparatus, comprising:

a first controller coupled with a buffer and with a memory array comprising non-volatile memory cells; and a bus coupled with the first controller, the first controller configured to send an indication of a time delay associated with an access command received by the first controller via a pin in electronic communication with the bus and designated for command or control information, wherein the first controller is configured to send the indication of the time delay as comprising one or more pulses on the pin of the apparatus, and wherein the first controller is configured to indicate a duration of the time delay based at least in part on a quantity of pulses, a pulse duration, or a pulse pattern, or any combination thereof.

15. The apparatus of claim 14, wherein the first controller is configured to determine the time delay based at least in part on availability in the buffer of data associated with a read command, availability in the buffer of space for data associated with a write command, or an activity level of the memory array, or any combination thereof.

16. The apparatus of claim 14, further comprising:

a system on a chip (SoC) or processor coupled with the bus, the SoC or processor configured to, based at least in part on the indication of the time delay, observe a fixed wait period before issuing a subsequent access command.

17. The apparatus of claim 14, further comprising:

a system on a chip (SoC) or processor coupled with the bus, the SoC or processor configured to, based at least in part on the indication of the time delay, observe a configurable wait period specified by the indication of the time delay before issuing a subsequent access command.

18. The apparatus of claim 14, further comprising:

a control component coupled with the bus, the control component configured to determine an operational mode of the apparatus based at least in part on receiving the indication of the time delay.

* * * * *